(12) United States Patent
Lasiter et al.

(10) Patent No.: US 10,734,332 B2
(45) Date of Patent: Aug. 4, 2020

(54) HIGH ASPECT RATIO INTERCONNECTS IN AIR GAP OF ANTENNA PACKAGE

(71) Applicant: QUALCOMM Incorporated, San Diego, CA (US)

(72) Inventors: Jon Bradley Lasiter, Stockton, CA (US); Ravindra Vaman Shenoy, Dublin, CA (US); Donald William Kidwell, Jr., Los Gatos, CA (US); Mohammad Ali Tassoudji, San Diego, CA (US); Vladimir Aparin, San Diego, CA (US); Seong Heon Jeong, San Diego, CA (US); Jeremy Dunworth, La Jolla, CA (US); Alireza Mohammadian, San Diego, CA (US); Mario Francisco Velez, San Diego, CA (US); Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/839,831

(22) Filed: Dec. 12, 2017

(65) Prior Publication Data
US 2019/0067221 A1 Feb. 28, 2019

Related U.S. Application Data

(60) Provisional application No. 62/548,958, filed on Aug. 22, 2017.

(51) Int. Cl.
*H01L 23/00* (2006.01)
*H01L 23/66* (2006.01)
(Continued)

(52) U.S. Cl.
CPC .............. *H01L 23/66* (2013.01); *H01L 21/50* (2013.01); *H01L 23/3114* (2013.01);
(Continued)

(58) Field of Classification Search
CPC ............... H01L 29/5389; H01L 29/538; H01L 23/5389; H01L 23/538; H01Q 1/2283
See application file for complete search history.

(56) References Cited

U.S. PATENT DOCUMENTS 5,023,624 A * 6/1991 Heckaman .............. H01L 23/66
333/247
7,728,774 B2 6/2010 Akkermans et al.
(Continued)

*Primary Examiner* — Kimberly N Rizkallah
*Assistant Examiner* — Alexander Belousov
(74) *Attorney, Agent, or Firm* — Muncy, Geissler, Olds & Lowe, P.C./Qualcomm

(57) ABSTRACT

In conventional packaging strategies for mm wave applications, the size of the package is dictated by the antenna size, which is often much larger than the RFIC (radio frequency integrated circuit). Also, the operations are often limited to a single frequency which limits their utility. In addition, multiple addition build-up layers are required to provide the necessary separation between the antennas and ground layers. To address these issues, it is proposed to provide a device that includes an antenna package, an RFIC package, and an interconnect assembly between the antenna and the RFIC packages. The interconnect assembly may comprise a plurality of interconnects with high aspect ratios and configured to connect one or more antennas of the antenna package with an RFIC of the RFIC package. An air gap may be formed in between the antenna package and the RFIC package for performance improvement.

31 Claims, 21 Drawing Sheets

(51) Int. Cl.
H01L 23/498 (2006.01)
H01L 23/552 (2006.01)
H01L 23/31 (2006.01)
H01L 21/50 (2006.01)
H01Q 1/22 (2006.01)
H01Q 1/24 (2006.01)
H01Q 21/10 (2006.01)
H01Q 19/24 (2006.01)
H01Q 9/16 (2006.01)
H01L 23/10 (2006.01)

(52) U.S. Cl.
CPC .... *H01L 23/4985* (2013.01); *H01L 23/49822* (2013.01); *H01L 23/49827* (2013.01); *H01L 23/49838* (2013.01); *H01L 23/552* (2013.01); *H01Q 1/2283* (2013.01); *H01Q 1/243* (2013.01); *H01Q 19/24* (2013.01); *H01Q 21/10* (2013.01); *H01L 23/10* (2013.01); *H01L 24/13* (2013.01); *H01L 24/16* (2013.01); *H01L 24/73* (2013.01); *H01L 24/81* (2013.01); *H01L 2223/6611* (2013.01); *H01L 2223/6616* (2013.01); *H01L 2223/6677* (2013.01); *H01L 2224/13101* (2013.01); *H01L 2224/16225* (2013.01); *H01L 2224/16227* (2013.01); *H01L 2224/32225* (2013.01); *H01L 2224/73204* (2013.01); *H01L 2224/81801* (2013.01); *H01L 2924/15311* (2013.01); *H01L 2924/15321* (2013.01); *H01Q 9/16* (2013.01)

(56) References Cited

U.S. PATENT DOCUMENTS

| | | |
|---|---|---|
| 9,265,151 B2 | 2/2016 | Juenemann et al. |
| 9,620,464 B2 | 4/2017 | Baks et al. |
| 10,340,249 B1* | 7/2019 | Yu ........................ H01L 23/3128 |
| 2006/0033664 A1* | 2/2006 | Soler Castany ........ H01L 23/66 |
| | | 343/700 MS |
| 2016/0049723 A1* | 2/2016 | Baks .................. H01L 23/49827 |
| | | 343/848 |
| 2017/0194270 A1 | 7/2017 | Webb |
| 2018/0145035 A1* | 5/2018 | Singh ................ H01L 23/49827 |
| 2018/0240762 A1* | 8/2018 | Kamgaing ............. H01L 25/16 |
| 2019/0058241 A1* | 2/2019 | So ........................ H01Q 1/2283 |

* cited by examiner

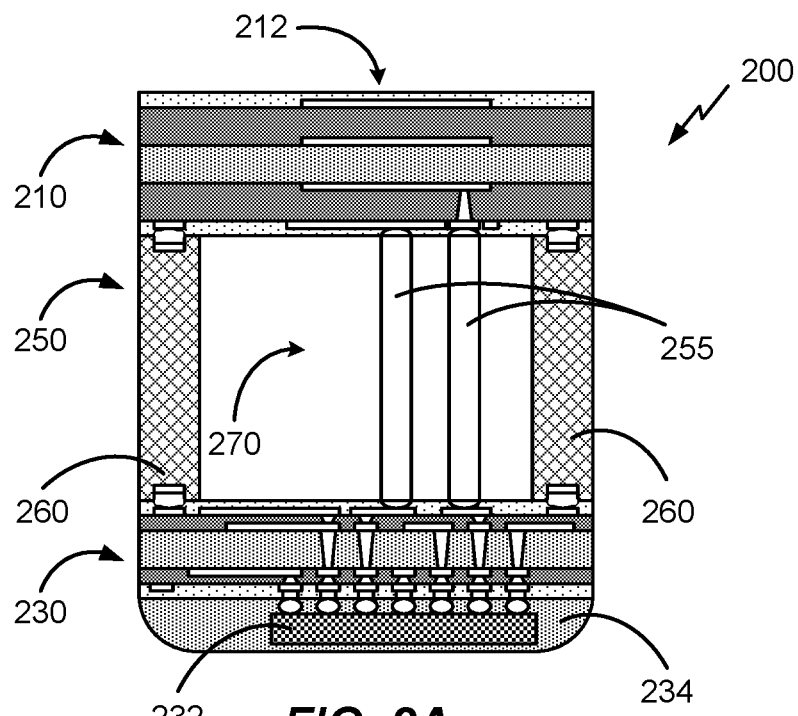
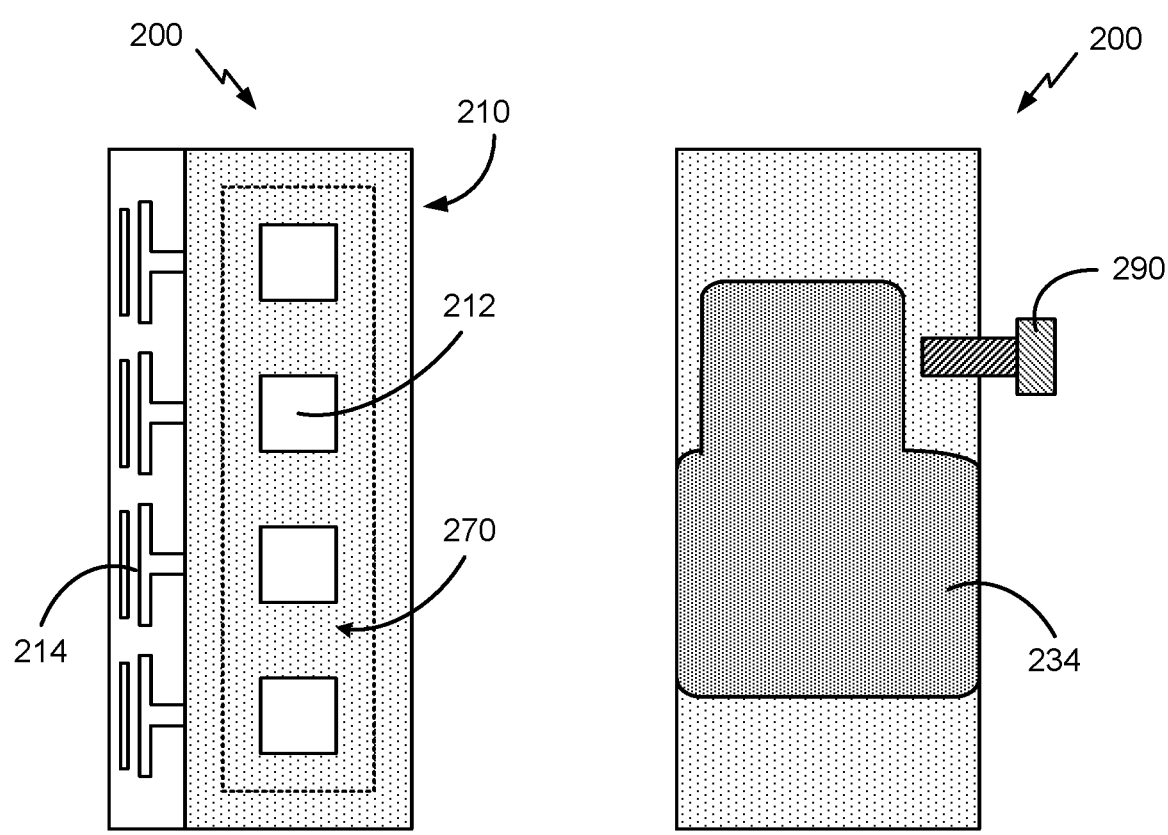
FIG. 2A
FIG. 2B
FIG. 2C

HIGH ASPECT RATIO INTERCONNECTS IN AIR GAP OF ANTENNA PACKAGE

CROSS-REFERENCE TO RELATED APPLICATIONS

The present Application for Patent claims the benefit of U.S. Provisional Application No. 62/548,958, entitled "HIGH ASPECT RATIO AIR GAP ANTENNA PACKAGE FOR MM WAVE", filed Aug. 22, 2017, assigned to the assignee hereof, and expressly incorporated herein by reference in its entirety.

FIELD OF DISCLOSURE

The field of the disclosed subject matter relates to device packaging. In particular, the field of the disclosed subject matter relates to high aspect ratio air gap antenna package for mm (millimeter) wave applications.

BACKGROUND

Fifth generation cellular networks, commonly referred to as 5G NR, are expected to include frequencies in the range of 24.25 to 86 GHz, with the lower 19.25 GHz (24.25-43.5 GHz) more likely to be used for mobile devices. For ease of reference, the waves in this range will be referred to as mm waves. It should be recognized that by definition, mm waves cover frequencies from 30 GHz to 300 GHz. Referring back to the expected 5G mm wave frequency range definition, the 19.25 GHz range that is more likely to be used in mobile devices can be divided into segments. Currently, each frequency segment is handled by an individual RFIC (radio frequency integrated circuit)/antenna package. Current packaging strategies used for the mm wave applications have several key issues (not exhaustive):

- The size of the package is dictated by the antenna size which is related to the frequency. The antenna size can be much larger than the RFIC.
- An LTCC (low temperature co-fired ceramic) package has good electrical performance, but is also more expensive relative to other packaging options.
- For an AOC (antenna-on-chip) package, the antenna is limited to the size of the chip which can limit performance, or increase cost if the chip size is increased to accommodate the antenna.
- For an FOWLP (fan-out wafer level package), the antenna package is aperture or proximity fed which can limit performance, e.g., relative to probe fed packages.
- For a POP (package-on-package), the antenna and the chip packages are connected using solder balls. The solder balls used for connecting the packages are isotopic in dimension so they limit the separation between packages. Additionally, the large solder balls also have large insertion losses (~1 dB).
- Some of the current solutions are limited to operation at a single frequency which limits their utility. For a global smart phone, an antenna package that can function over large number of bands (frequencies) is desired.
- Current solutions using FCBGA (flip chip ball grid array) construction requires use of multiple additional build-up layers to achieve a symmetric structure and the required separation between the antenna and ground layers (~400 µm). For larger separation between the antenna and the ground layer (~1 mm or more), this type of package requires a prohibitive number of build-up layers which adds to cost and manufacturing complexity

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary device is disclosed. The device may comprise an antenna package and an RFIC package below the antenna package. The antenna package may comprise one or more antennas and the RFIC package may comprise an RFIC. The device may also comprise an interconnect assembly in between the antenna package and the RFIC package. The interconnect assembly may comprise first and second supports configured to provide mechanical support to the antenna package. The interconnect assembly may also comprise a plurality of interconnects configured to electrically connect the one or more antennas with the RFIC. There may be an air gap in the device bounded by the first and second supports, a lower surface of the antenna package, and an upper surface of the RFIC package. The plurality of interconnects may be laterally in between the first and second supports within the air gap.

An exemplary method is disclosed. The method may comprise forming an antenna package and forming an RFIC package below the antenna package. The antenna package may comprise one or more antennas and the RFIC package may comprise an RFIC. The method may also comprise forming an interconnect assembly in between the antenna package and the RFIC package. The interconnect assembly may comprise first and second supports configured to provide mechanical support to the antenna package. The interconnect assembly may also comprise a plurality of interconnects configured to electrically connect the one or more antennas with the RFIC. An air gap may be formed in the device bounded by the first and second supports, a lower surface of the antenna package, and an upper surface of the RFIC package. The plurality of interconnects may be formed to be laterally in between the first and second supports within the air gap.

An exemplary device is disclosed. The device may comprise an antenna package and an RFIC package below the antenna package. The antenna package may comprise one or more antennas and the RFIC package may comprise an RFIC. The device may also comprise an interconnect assembly in between the antenna package and the RFIC package. The interconnect assembly may comprise first and second supports configured to provide mechanical support to the antenna package. The interconnect assembly may also comprise means for electrically connecting the one or more antennas with the RFIC. There may be an air gap in the device bounded by the first and second supports, a lower surface of the antenna package, and an upper surface of the RFIC package. The plurality of interconnects may be laterally in between the first and second supports within the air gap.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIGS. 1A and 1B illustrate a conventional antenna device;

FIGS. 2A-2C illustrate an example of a device according to an aspect;

DETAILED DESCRIPTION

Aspects of the subject matter are provided in the following description and related drawings directed to specific examples of the disclosed subject matter. Alternates may be devised without departing from the scope of the disclosed subject matter.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., ASICs (application specific integrated circuits)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

Figure 1A:
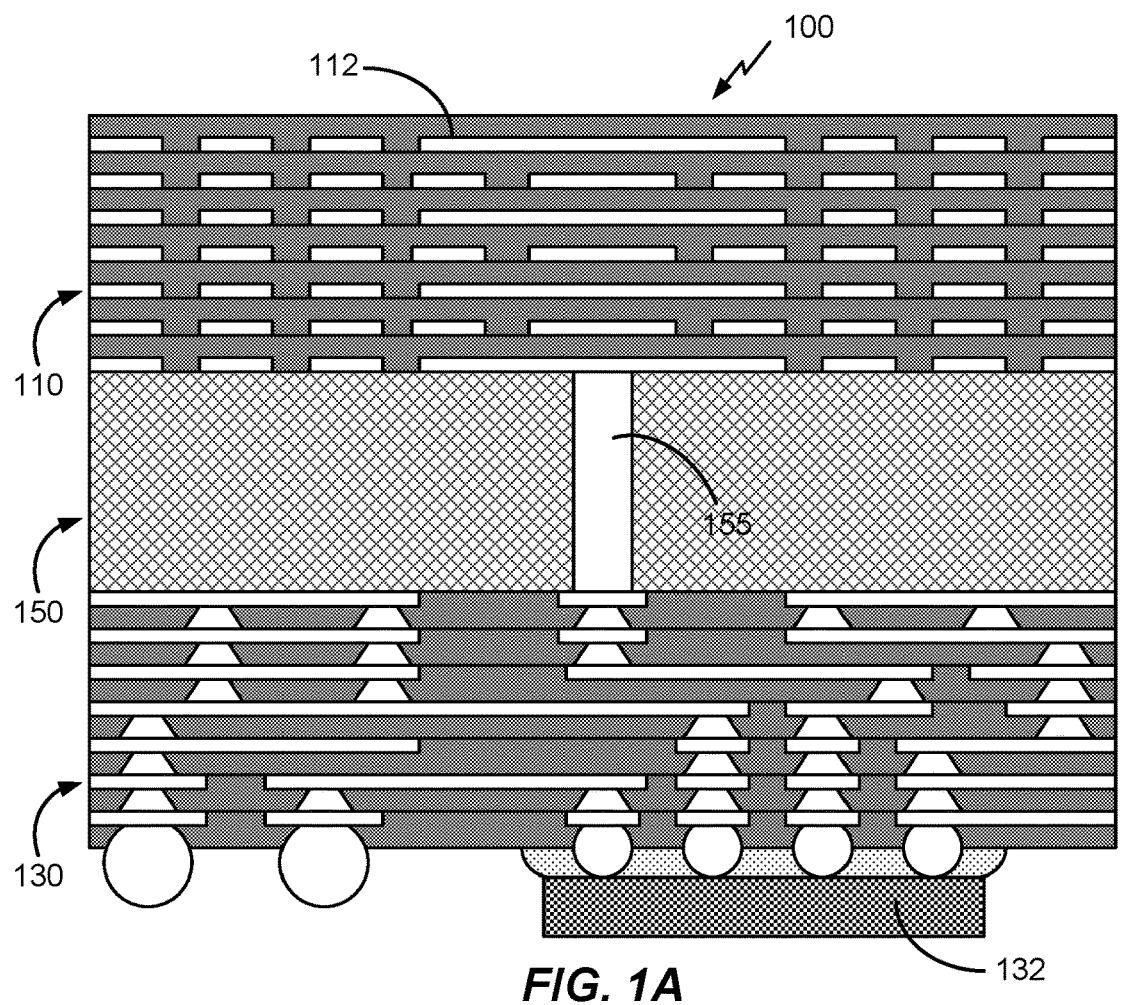
Figure 1B:
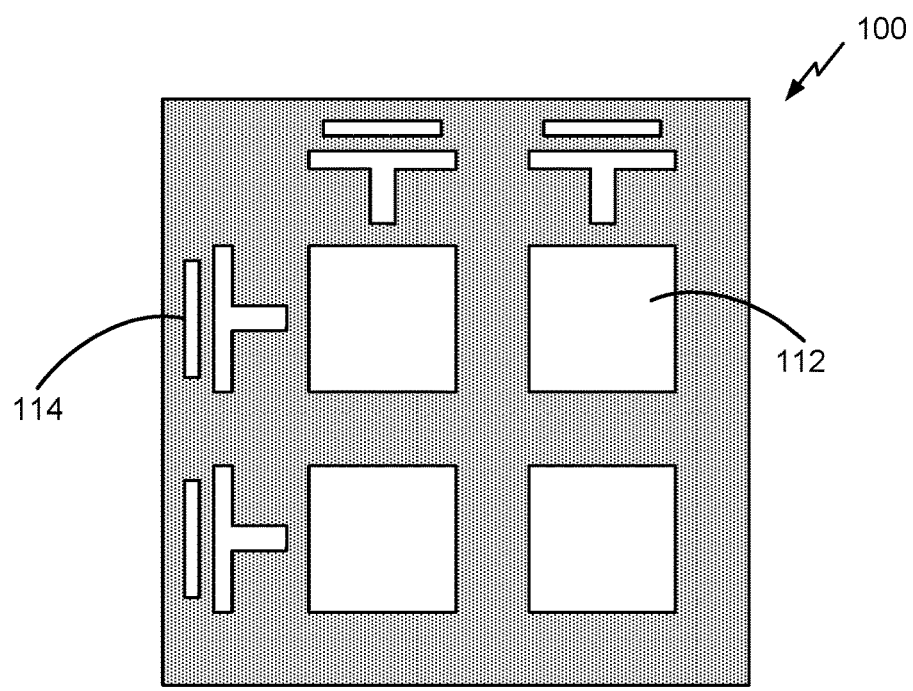

As indicated above, the conventional packaging strategies for mm wave applications have several issues. FIGS. 1A and 1B illustrates an example of an antenna device 100 based on an existing technique using FCBGA (flip chip ball grid array) construction. FIG. 1A illustrates a side view and FIG. 1B illustrates a bottom view. The device 100 includes antenna layers 110, an RFIC routing layers 130, and a core 150. Typically the RFIC routing layer adjacent to the core is also a ground layer. An interconnect 155 in the core 150 is used to feed signals from a RFIC 132 to antennas 112, 114. In this conventional technique, multiple additional build-up layers can be required to achieve a symmetric structure and a necessary separation (e.g., 400 μm) between the antenna and ground layers. For example, the number of layers can be up to 14 or more (e.g., see FIG. 1A).

It would be desirable to package devices that address some or all of the issues related to conventional packaging strategies. In an aspect, it is proposed to provide a high aspect ratio antenna package device. An example of a proposed device 200 is illustrated in FIGS. 2A-2C. FIG. 2A illustrates a side view, FIG. 2B illustrates a top view, and FIG. 2C illustrates a bottom view. It should be noted that terms such as "upper", "lower", "top", "bottom", "left", "right", "vertical", "lateral", "first", "second" and so on are used merely as terms of convenience, and should not be taken to be limiting.

The illustrated device 200 may be a device for mm wave applications. While the 5G frequency range may be of particular interest, the device 200 is not limited to this range only. The aspects discussed herein may be applicable over wide ranges of frequencies. The device 200 may comprise an antenna package 210. The antenna package 210 may comprise one or more antennas such as patch antennas 212. For example, in FIG. 2B, the antenna package 210 is illustrated as comprising four patch antennas 212.

The device 200 may also comprise an RFIC package 230 below the antenna package 210. In an aspect, the RFIC package 230 may also comprise one or more other antennas such as dipole antennas 214. For example, the RFIC package 230 is illustrated as comprising four dipole antennas 214. The RFIC package 230 may also comprise an RFIC 232, which may be overmolded with a mold 234. The RFIC 232 may be configured to process mm waves received via the antennas 212, 214. The RFIC 232 may also be configured to transmit mm waves via the antennas 212, 214.

The device 200 may further comprise a plurality of interconnects 255 vertically positioned in between the antenna package 210 and the RFIC package 230 (e.g., see FIG. 2A). Again, the term "vertical" is used merely for convenience, and is not meant to indicate an absolute direction. In an aspect, the vertical direction may be viewed as a direction of a line that intersects the antenna package 210 and the RFIC package 230. In the figures, this corresponds to an up/down direction. The term "lateral" may then be viewed as indicating side-to-side direction as viewed in the figures.

The plurality of interconnects 255 may be configured to electrically connect the antenna package 210 with the RFIC package 230. In particular, the plurality of interconnects 255 may electrically couple the patch antennas 212 with the RFIC 232. For ease of description, the structure in between the antenna package 210 and the RFIC package 230 will be referred to as the "interconnect assembly" 250. It then may be said that the interconnect assembly 250, which is vertically positioned in between the antenna package 210 and the RFIC package 230, may comprise the plurality of interconnects 255.

The interconnect assembly 250 may also comprise a plurality of supports 260 (e.g., see FIG. 2A). The plurality of supports 260 may be configured to provide mechanical support to the device 200 such that a desired distance between the antenna package 210 and the RFIC package 230 can be maintained. For example, for superset application, up to 3.0 mm of separation or more is possible. The supports 260 may be formed from electrically insulating materials.

An air gap 270 may be formed between the antenna package 210 and the RFIC package 230 (e.g., see FIG. 2A) in the interconnect assembly 250. This is unlike the conventional antenna device 100 in which a core is filled with a dielectric (e.g., see FIG. 1A). The air gap 270 may be bounded on its sides by the supports 260, above by a lower surface of the antenna package 210, and below by an upper surface of the RFIC package 230. The interconnects 255 within the air gap 270 may connect the lines on the antenna package 210 to the lines of the RFIC package 230. The air gap 270 can enable the device 200 to have superior performance. For example, a bandwidth of the device 200 may be wider than that of the conventional antenna device 100 due to the air gap 270.

The air gap 270 may be such that one or more antennas 212 of the antenna package 210 vertically overlap the air gap 270. In FIG. 2B, an outline of the air gap 270 as viewed from above is shown as a dashed rectangle. In this example, all four patch antennas 212 of the antenna package 210 are illustrated as vertically overlapping the air gap 270. Referring back to FIG. 2A, the RFIC 232 may also vertically overlap, at least partially, the air gap 270 and the antenna 212. In this way, lengths of the interconnects 255 can be minimized.

The device 200 may also comprise an external connect 290 (e.g., see FIG. 2C). The external connect 290, which may be flexible, may be configured to electrically connect the device 200 with other packages and devices external to the device 200.

Figure 3A:
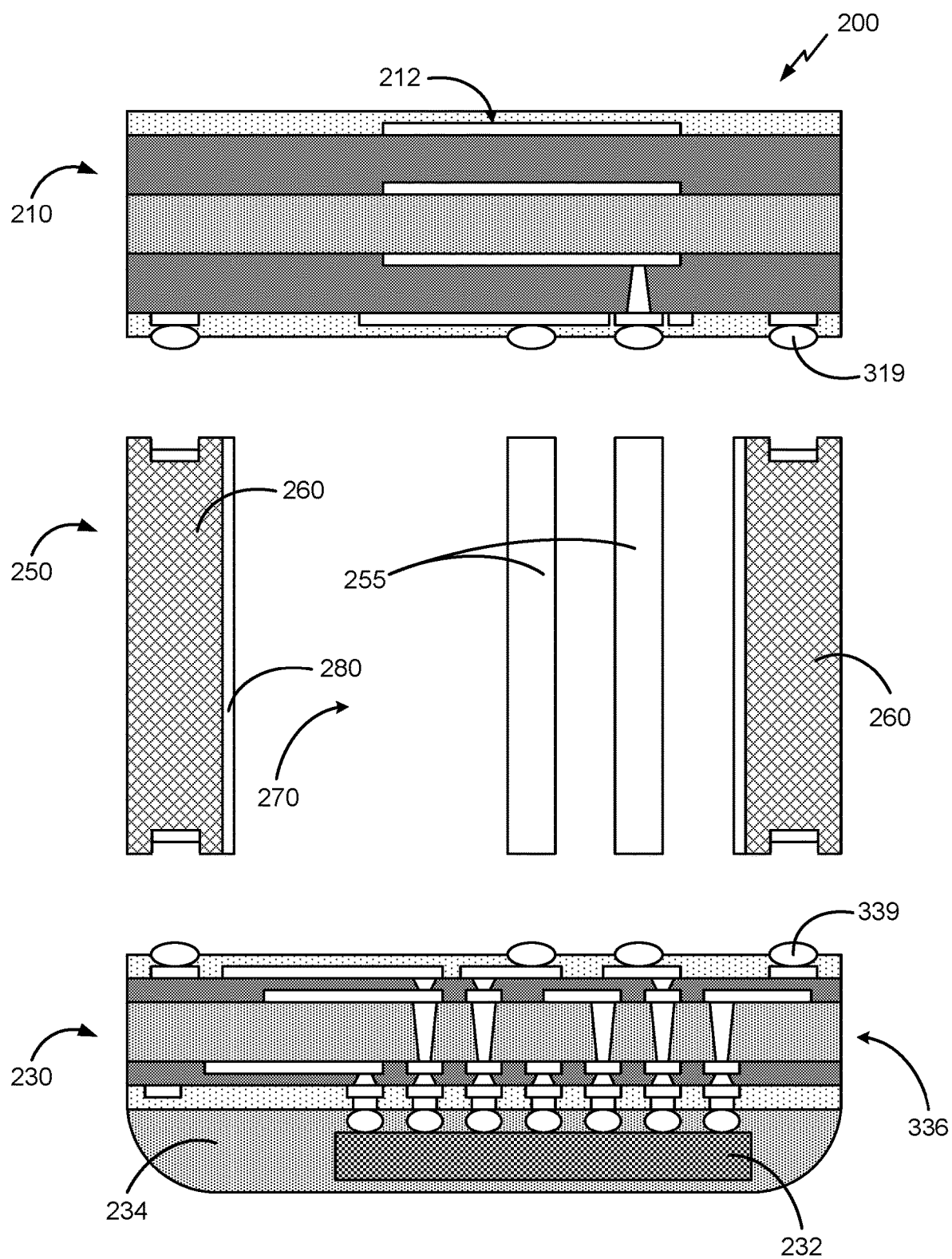
FIG. 3A illustrates magnified side views of the device of FIGS. 2A-2B according to an aspect.

FIG. 3A provides a magnified side view of the device 200. In FIG. 3A, the antenna package 210, the RFIC package 230, and the interconnect assembly 250 are separated for enhanced understanding. As seen, the antenna package 210 may comprise a plurality of metal layers separated by a plurality of substrate layers. For example, the antenna package 210 may be a multi-layered antenna PCB (printed circuit board) package. In an aspect, low loss materials may be used with coarse line and space construction (e.g., 75 μm L/S). The materials may also be flexible materials. In FIG. 3A, the antenna package 210 is illustrated as a four-layer antenna PCB package, but more or less layers are contemplated in this disclosure.

The plurality of metal layers in the antenna package 210 may form the antennas 212. The antennas 212 may be patch antennas 212. Preferably, the patch antennas 212 are probe-fed from the RFIC 232 via the plurality of interconnects 255. However, it is also contemplated that the patch antennas 212 can be aperture-fed or proximity-fed. It is further contemplated that different antennas 212 may be fed differently.

Figure 4A:
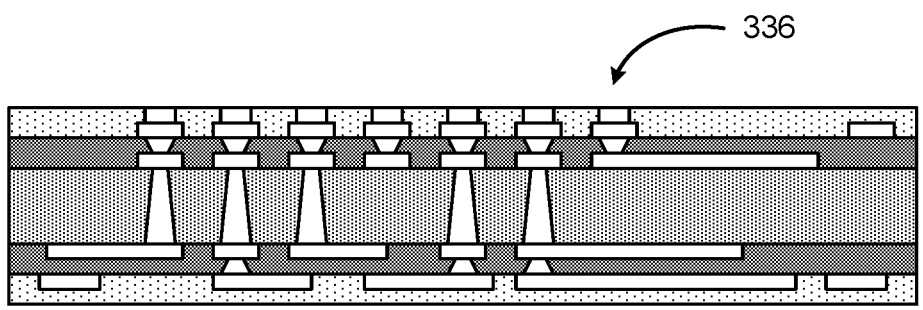
FIGS. 4A-4D illustrate different stages of assembling an RFIC package according to an aspect.

The RFIC package 230 may comprise the RFIC 232 encapsulated in a mold 234. The RFIC 232 may be attached to a substrate 336. FIGS. 4A-4D illustrate different stages of an example process for assembling the RFIC package 230. FIG. 4A illustrates a stage in which the substrate 336 may be provided. The substrate 336 may include one or more metal layers for signal routing. For example, the substrate 336 may be a package substrate, a laminate, an interposer, a PCB substrate, and LTCC substrate, or other planar multilayer structure. The substrate 366 may be organic or inorganic.

Figure 4B:
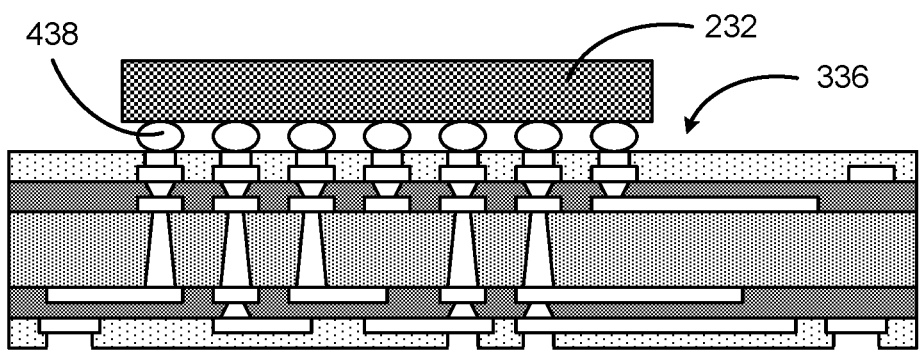
Figure 4C:
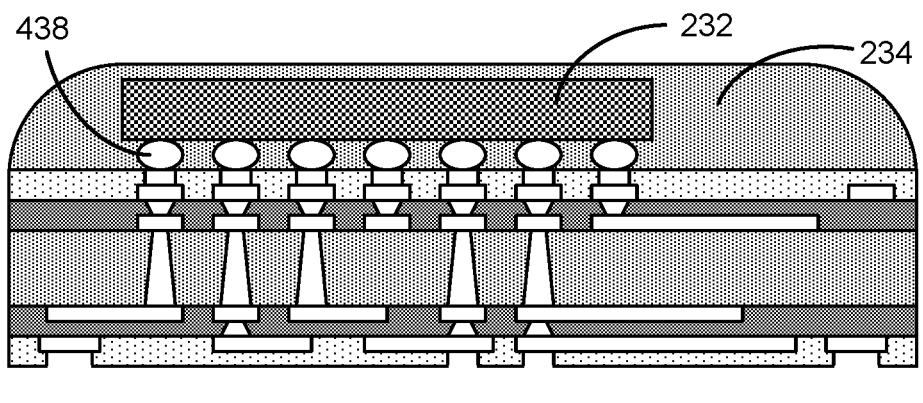
Figure 4D:
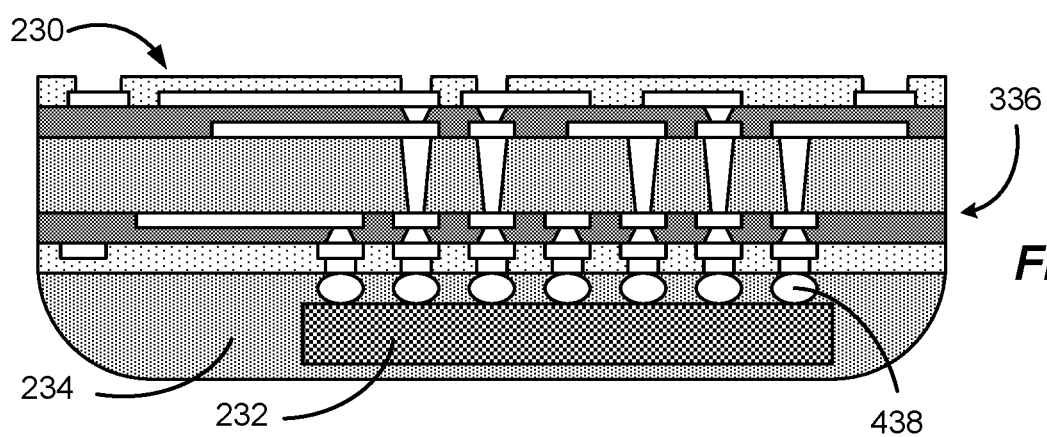

In FIG. 4A, the substrate 336 is illustrated as a four-layer substrate, but more or less layers are contemplated. FIG. 4B illustrates a stage in which the RFIC 232 may be attached to the substrate 336. The RFIC 232 may be a flip chip die, a wafer level package (WLP) die, or a wafer level chip scale package (WLCSP) die. The RFIC 232 may be attached such that the conductive balls 438 of the RFIC 232 make electrical contacts with appropriate conductors in the substrate 336. In addition, passive components (e.g., resistors, inductors, capacitors) may also be attached to the substrate 336. FIG. 4C illustrates a stage in which the mold 234 may be deposited on the substrate 336 to encapsulate the RFIC 232. The RFIC 232 may be overmolded. FIG. 4D illustrates a stage in which the RFIC package 230 may be flipped to a desired orientation.

Thereafter, referring back to FIG. 3A, solders 339 may be formed on the substrate 336. The solders 339 may correspond to the plurality of supports 260 and to the plurality of interconnects 255. Note that the antenna package 210 may include solders 319 on its lower surface also corresponding to the supports 260 and to the interconnects 255.

The interconnect assembly 250 may comprise the plurality of interconnects 255 configured to electrically connect the antenna package 210 with the RFIC package 230. In particular, the plurality of interconnects 255 may be configured to electrically connect the antennas 212 with the RFIC 232. For example, the plurality of interconnects 255 may include one or more signal interconnects configured to carry signals between the RFIC 232 and the antennas 212. Recall that in an embodiment, the antennas 212 may be probe-fed. For each probe-fed antenna 212, one or more signal interconnects 255 may be used.

The plurality of interconnects 255 may also include one or more ground interconnects configured to electrically connect a ground layer of the RFIC package 230 with a ground layer of the antenna package 210. It should be noted that the ground interconnects are optional, i.e., the interconnects 255 may comprise only the signal interconnects. However, when the ground interconnects are included, they may be constructed so as to shield the signal interconnects.

In FIG. 3A, two interconnects 255 are illustrated, and one may serve as the signal interconnect and the other may serve as the ground interconnect. The signal interconnect may be configured to carry signals between the RFIC 232 and the antenna 212—e.g., from the RFIC 232 to the antenna 212 for transmit (Tx) and from the antenna 212 to the RFIC 232 for receive (Rx).

The signal and/or the ground interconnects may vertically overlap with the antenna 212 at least partially. To maximize the amount of air space in the air gap 270, it may be preferred that the plurality of interconnects 255 have a high aspect ratio, i.e., be long and thin. For example, a width (e.g., diameter) of an interconnect 255 may be as low as 0.05 mm (50 microns) (or even lower) and its height may be up to 3.0 mm (or even greater). The high aspect ratio allows for the desired separation between the antenna 212 and ground to occur and thereby improve performance.

In an aspect, the plurality of interconnects 255 may be formed as electrically conductive columns such as copper columns or pins. To state it another way, each signal interconnect may be a signal column. When provided, each ground interconnect may be a ground column. Compared to solder balls for example, the copper columns allow for a much greater aspect ratios (e.g., at least 1.2 and up to 40 or even higher) to be achieved.

Figure 3B:
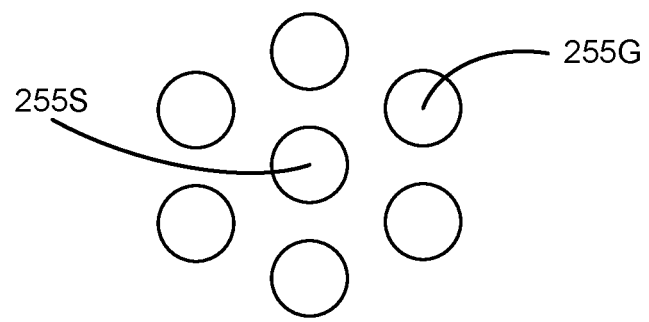
FIGS. 3B and 3C illustrate example arrangements of a plurality of interconnects according to an aspect.
Figure 3C:
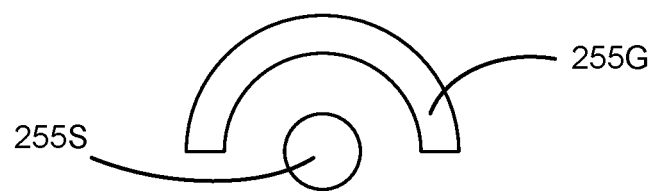

While two interconnects 255 are illustrated in FIG. 3A, there can be many more interconnects 255 with one or more serving as the signal interconnects, and zero or more serving as the ground interconnects. FIG. 3B illustrates a top view of an example arrangement of the plurality of interconnects 255. Recall that the ground interconnects, when provided, may be constructed to shield the signal interconnects. In the example arrangement of FIG. 3B, a plurality of ground interconnects 255G (e.g., plurality of ground columns) may surround a signal interconnect 255S (e.g., signal column) for shielding. Another way to shield the signal interconnect 255S is to provide the ground interconnect 255G (e.g., ground column) that is shaped (e.g., semi-circle) to surround the signal interconnect 255S (e.g., signal column) at least partially as illustrated in FIG. 3C.

Again referring back to FIG. 3A, the interconnect assembly 250 may also comprise the plurality of supports 260 configured to provide mechanical support to the device 200 such that a desired distance between the antenna package 210 and the RFIC package 230 can be maintained. The plurality of supports 260 may be formed from electrically insulating materials such as dielectric materials. The plurality of interconnects 255 may be laterally positioned in between the first and second supports 260. In other words, the plurality of interconnects 255 may be within the air gap 270 bounded by the first and second supports 260.

Optionally, one or both inner sidewalls of the first and second supports 260 may be covered with metal layers 280 using processes including electroless plating, electrolytic plating or vacuum deposition processes such as sputtering or evaporation. When the metal layers 280 are present, they may define the side boundaries of the air gap 270. Conductive metals that can be used include any combination of copper, nickel, palladium and gold. The deposited metal layer 280 may be used as ground. For example, the deposited metal layer 280 may connected the ground layer of the RFIC package 230 and/or to the ground layer of the antenna package 210. So as to minimize clutter, the metal layers 280 are not included in other figures that illustrate the interconnect assembly 250. But it should be noted that any of the illustrated interconnect assembly 250 may include the metal layers 280 on the inner sidewalls of one or both of the first and second supports 260.

First and second supports 260 are illustrated in FIG. 3A. In an aspect, the first and second supports 260 themselves can have high aspect ratios, which can help to minimize total package area. For performance reasons, it may be preferable to minimize any vertical overlap between the antenna 212 and the plurality of supports 260. FIG. 3A illustrates that the first and second supports 260 do not vertically overlap with the antenna 212 (see also FIG. 2A). Minimizing overlap between the antenna 212 and the supports 260 maximizes the air gap 270 that is below the antenna 212.

In an aspect, the first and second supports 260 may be a part of one support structure. For example, a support structure may surround the plurality of interconnects 255 between the antenna package 210 and the RFIC package 230. Recall that in FIG. 2B, the dashed rectangle represented an outline of the air gap 270 as viewed from above. It is recognized that a rectangular box-shaped air gap in 3D is bounded on six sides, and the dashed rectangle in FIG. 2B may correspond to the four inner sidewalls of the support structure. In FIG. 3A, the first and second supports 260 may be opposite sides of the support structure when viewed vertically (e.g., from top or bottom). It should be noted that the air gap 270 is not limited to the rectangular shape.

The interconnect assembly 250 may be attached to the antenna package 210 and to the RFIC package 230 (e.g., see also FIG. 2A). For example, a reflow solder process may be performed on the solders 319 and 339. The attaching of the interconnect assembly 250 to the antenna package 210 and to the RFIC package 230 can define the boundaries of the air gap 270 on all sides. Thereafter, the external connect 290 may be attached.

Figure 5A:
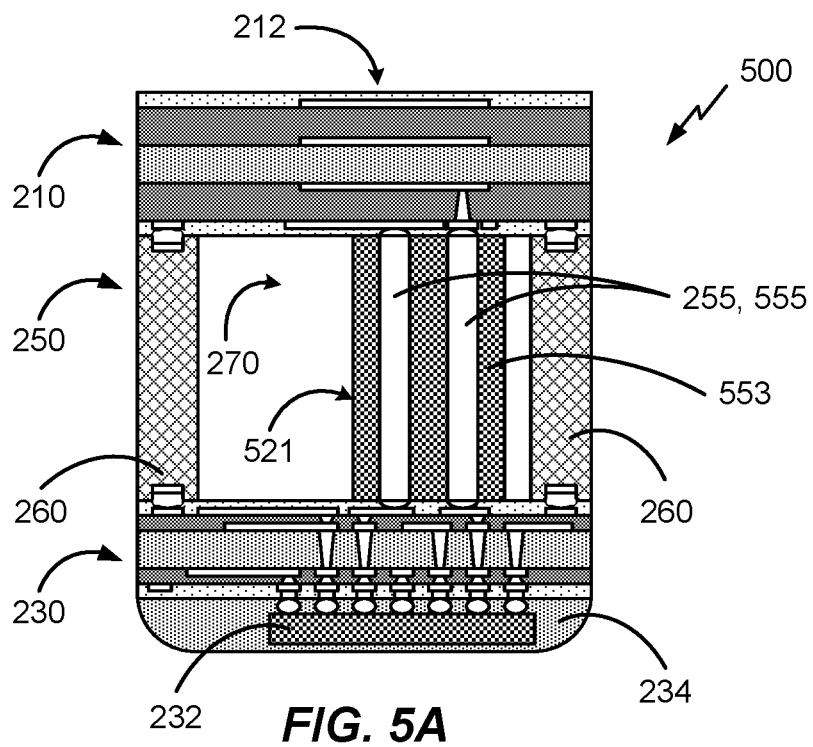
FIG. 5A illustrates an example of a device according to an aspect.

FIG. 5A illustrates a device 500 that differs from the device 200 in that the interconnect assembly 250 may include a via bar 521 for electrically connecting between the antenna package 210 and the RFIC package 230. The via bar 521 may comprise a substrate 553 at least partially surrounding a plurality of through-board-vias (TBV) 555. The substrate 553 can be formed from a variety of materials such as glass, ceramics, organic substrates, and so on.

In an aspect, the TBVs 555 may be constructed by forming holes in the substrate 553 and filling the holes with conductive materials such as copper. In another aspect, the TBVs 555 may be formed first, and subsequently surrounded with the substrate 553. The TBVs 555 can have high aspect ratios. For example, a TBV 555 with a diameter of 100 µm and a height of 400 µm (e.g., aspect ratio of 4) can be formed.

The plurality of TBVs 555 may serve the role of the plurality of interconnects 255 in the device 500. That is, the plurality of TBVs 555 may be configured to electrically connect the antenna package 210 with the RFIC package 230. For example, the plurality of TBVs 555 may include one or more signal TBVs configured to carry signals between the RFIC 232 and the antennas 212. Preferably, the antennas 212 are probe-fed through the signal TBVs. Of course, aperture-fed and proximity-fed antennas 212 are also contemplated. The plurality of TBVs 555 may also include one or more ground TBVs configured to electrically connect a ground layer of the RFIC package 230 with a ground layer of the antenna package 210. When included, the ground TBVs may be constructed so as to shield the signal TBVs.

Figure 5B:
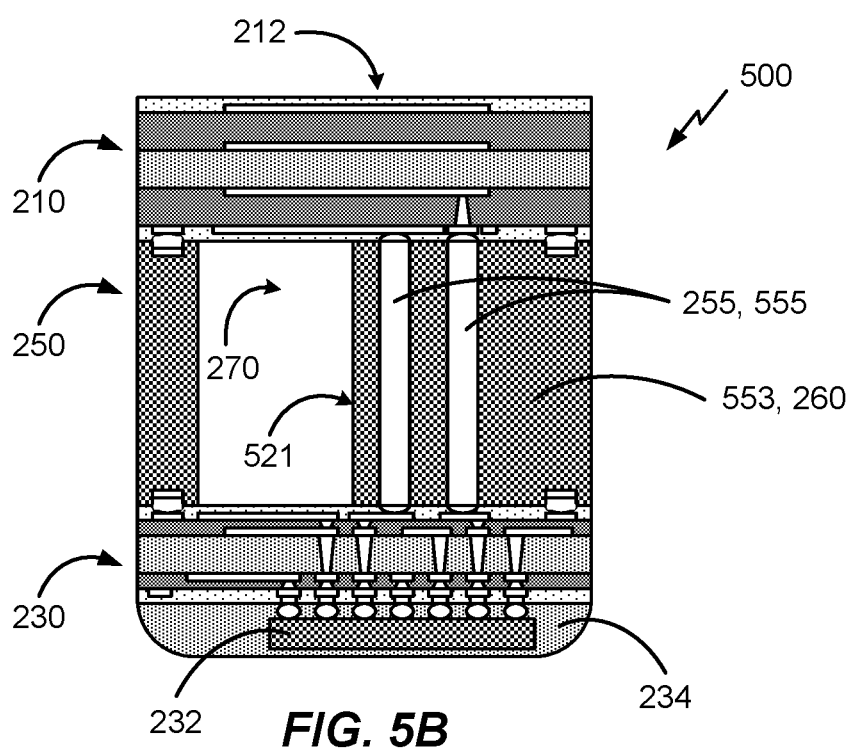
FIG. 5B illustrates an example of a variation of the device of FIG. 5A according to an aspect.

FIG. 5B illustrates an example of a variation of the device of FIG. 5A according to an aspect. In FIG. 5B, the substrate 553 (e.g., glass) may provide the mechanical support. That is, the first and second supports 260 may comprise the substrate 553. More generally, the first and second supports 260 may be formed from the same material as the substrate 553 of the via bar 521, i.e., the first and second supports 260 may comprise the substrate 553.

Figure 6A:
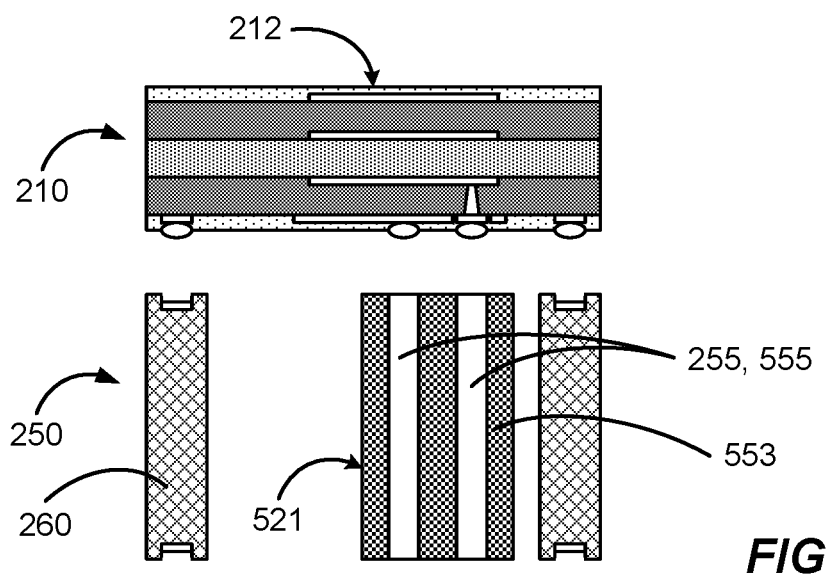
FIGS. 6A and 6B illustrate different stages of an example process of assembling the device of FIG. 5A according to an aspect.
Figure 6B:
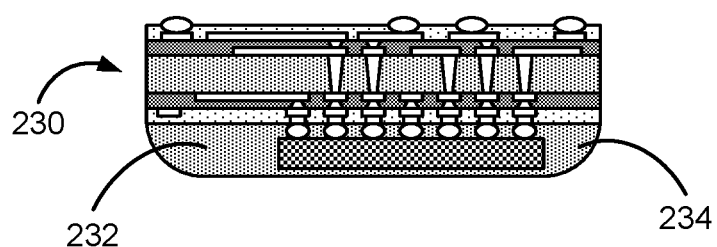
Figure 6B:
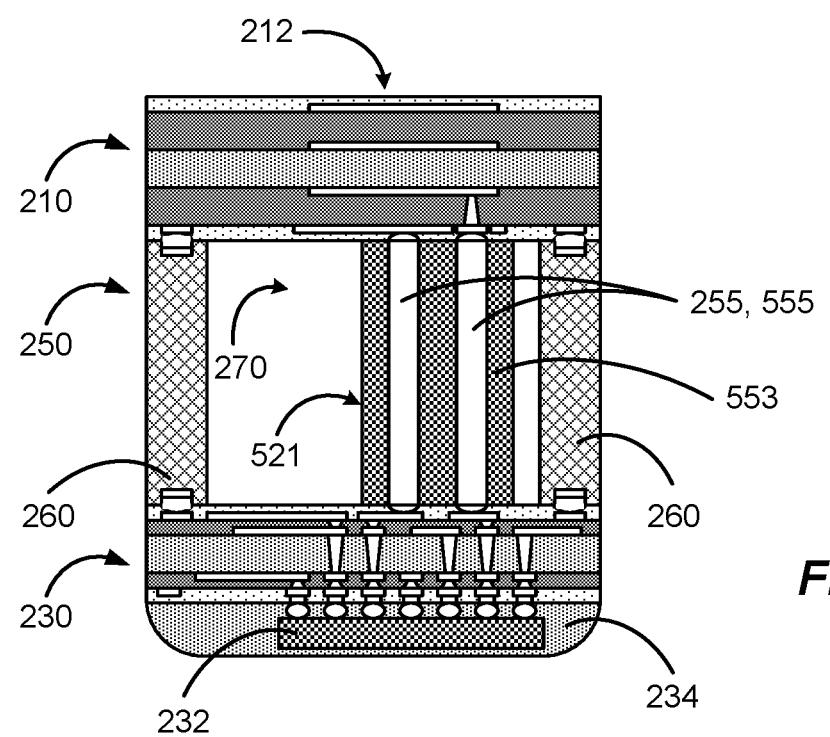

FIGS. 6A and 6B illustrate different stages of an example process for assembling the device 500 of FIG. 5A. FIG. 6A illustrates a stage in which the antenna package 210 and the RFIC package 230 may be provided. The interconnect assembly 250—the supports 260 and the via bar 521—may also be provided in this stage. FIG. 6B illustrates a stage in which the interconnect assembly 250 may be attached to the antenna package 210 and to the RFIC package 230, which can define the boundaries of the air gap 270 on all sides. For example, a reflow solder process may be performed. While not shown, the external connect 290 may be attached to enable connections with external devices.

In a variant (not shown), the interconnect assembly 250 of FIG. 5B may be provided in a stage similar to that of FIG. 6A. When the interconnect assembly 250 of FIG. 5B is subsequently attached to the antenna package 210 and to the RFIC package 230, the substrate 553 may also provide mechanical support to the device 500.

Figure 7A:
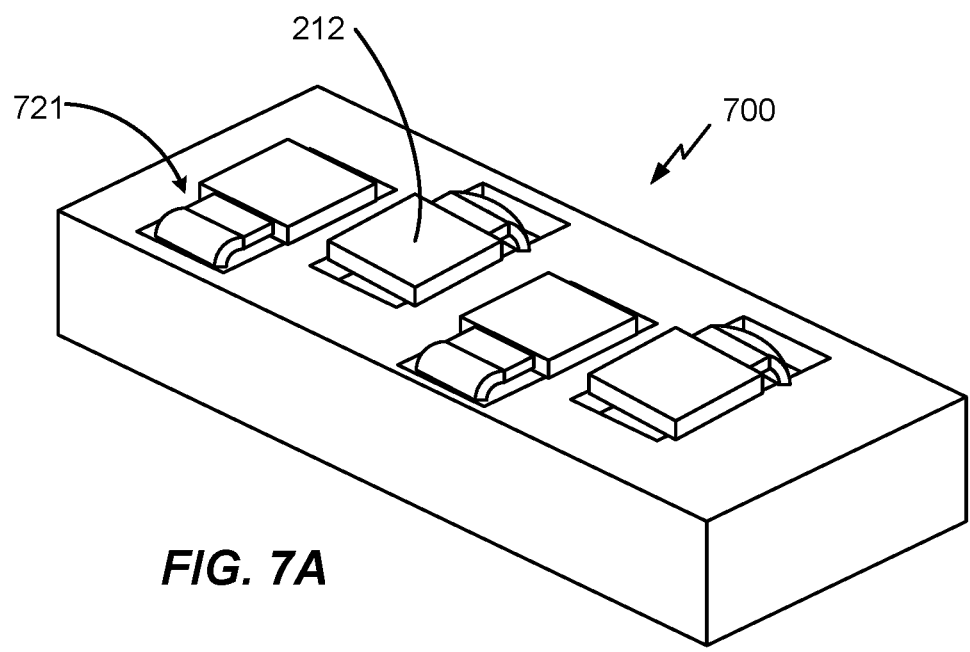
FIGS. 7A-7C illustrate an example of a device according to an aspect.
Figure 7B:
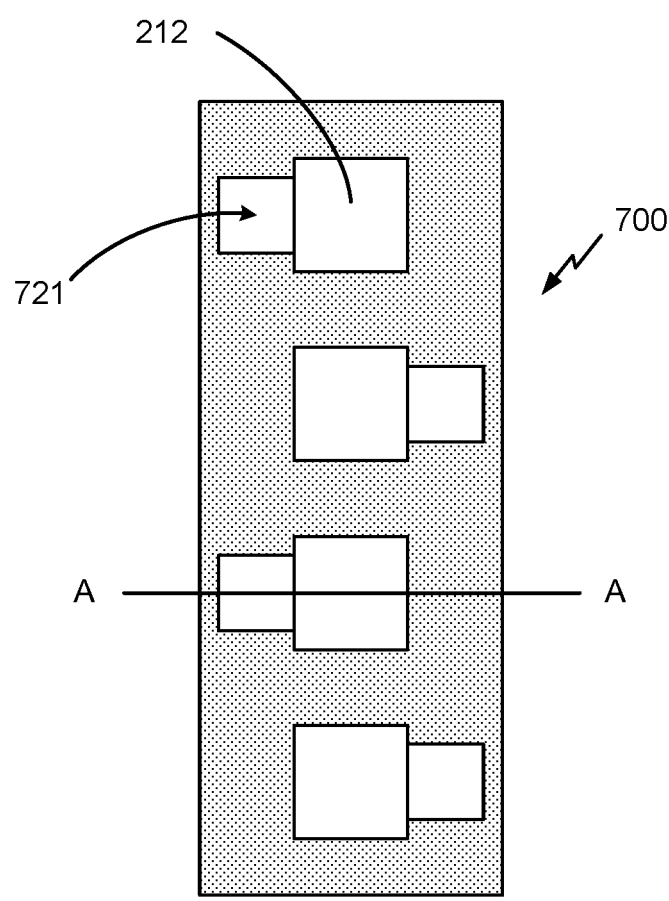
Figure 7C:
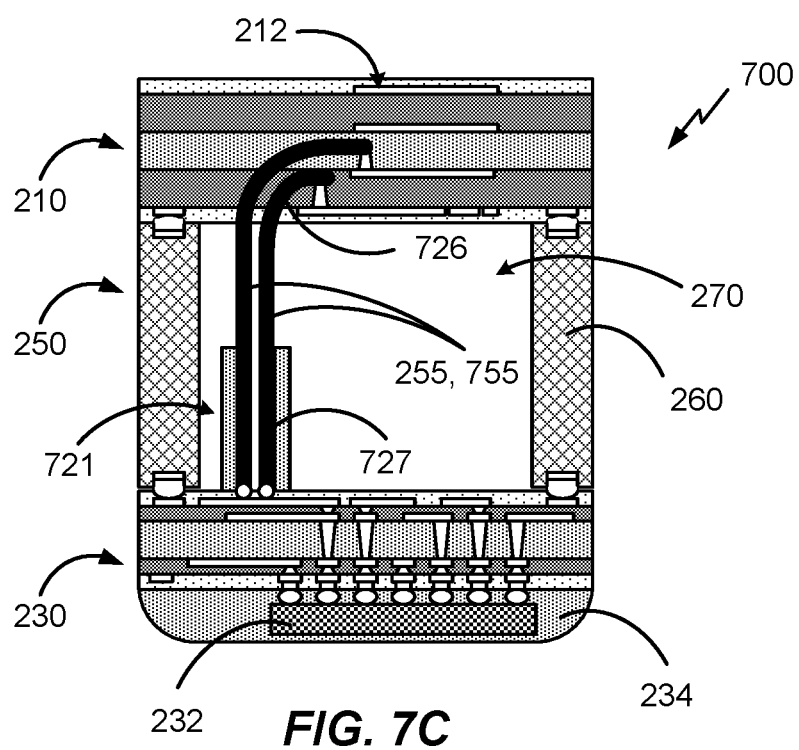

FIGS. 7A-7C illustrate a device 700 that may use another mechanism for electrically connecting the antenna package 210 with the RFIC package 230. FIG. 7A illustrates a perspective view, FIG. 7B illustrates a top view, and FIG. 7C illustrates a side view of the device 700 along the line "A-A" of FIG. 7B. As seen in FIG. 7C, the interconnect assembly 250 may comprise a flex substrate 721 configured to physically route the plurality of interconnects 255 (e.g., wires 755). The flex substrate 721 may include a flexible portion 726 and a rigid portion 727. The flexible portion 726 may route the wires 755 laterally to electrically connect with the antenna package 210. The rigid portion 727 may route the wires 755 vertically to electrically connect with the RFIC package 230. The rigid portion 727 may be vertically positioned in between the antenna package 210 and the RFIC package 230, i.e., in the air gap 270. However, the rigid portion 727 need not overlap vertically with the antenna 212. In this way, performance may be enhanced even further. Grounded shielding layers can be provided to surround the signal wires.

Figure 8A:
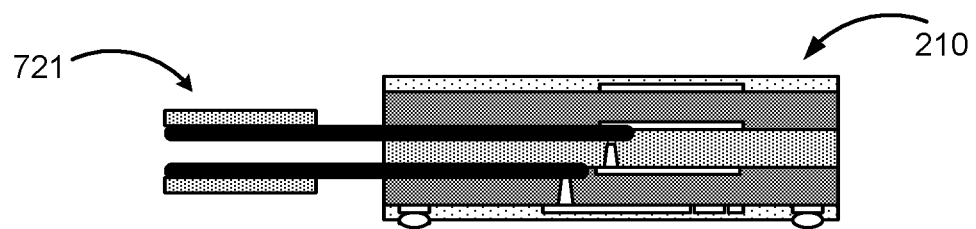
FIGS. 8A-8D illustrate different stages of an example process of assembling the device of FIGS. 7A-7C according to an aspect.
Figure 8B:
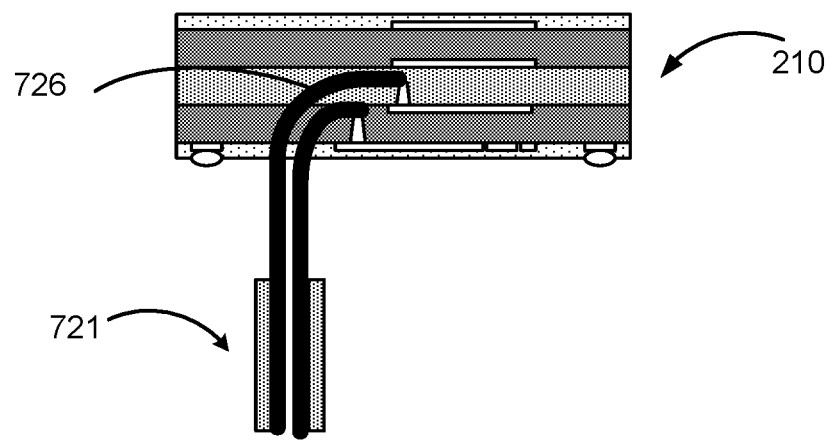
Figure 8C:
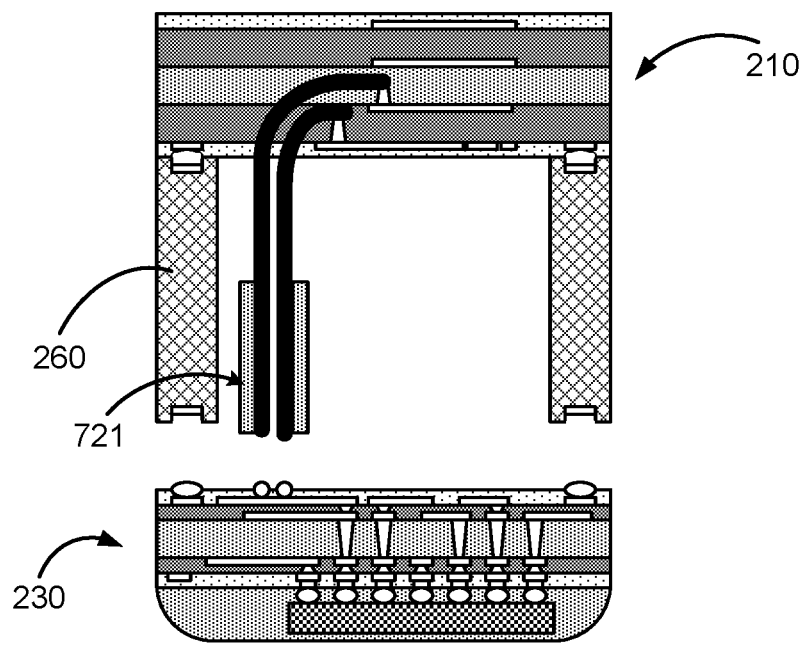
Figure 8D:
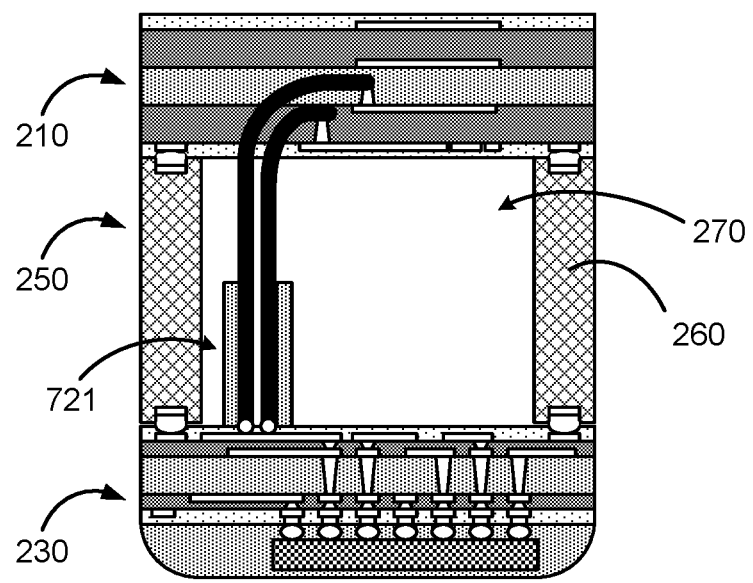

FIGS. 8A-8D illustrate different stages of an example process for assembling the device 700 of FIGS. 7A-7C. FIG. 8A illustrates a stage in which the flex substrate 721 may be electrically connected with the antenna package 210. FIG. 8B illustrates a stage in which the flexible portion 726 may be bent. FIG. 8C illustrates a stage in which the supports 260 may be provided and attached to the antenna package 210. FIG. 8D illustrates a stage in which interconnect assembly 250 may be attached to the RFIC package 230. For example, a reflow solder process may be performed. The attaching may define the boundaries of the air gap 270 on all sides. While not illustrated, the external connect 290 may be attached to enable connections with external devices.

Figure 9:
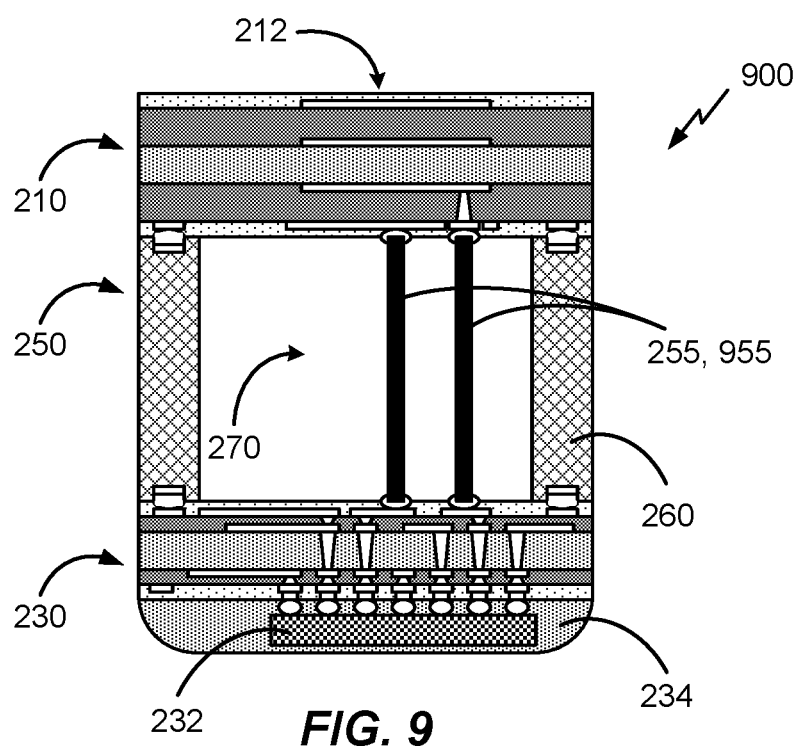
FIG. 9 illustrates an example of a device according to an aspect.
Figure 10A:
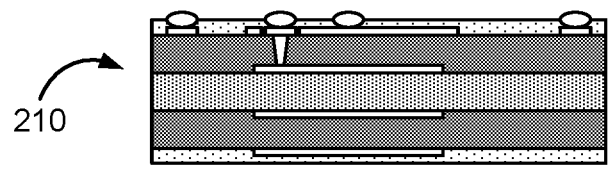
FIGS. 10A-10H illustrate different stages of an example process of assembling the device of FIG. 9 according to an aspect.
Figure 10B:
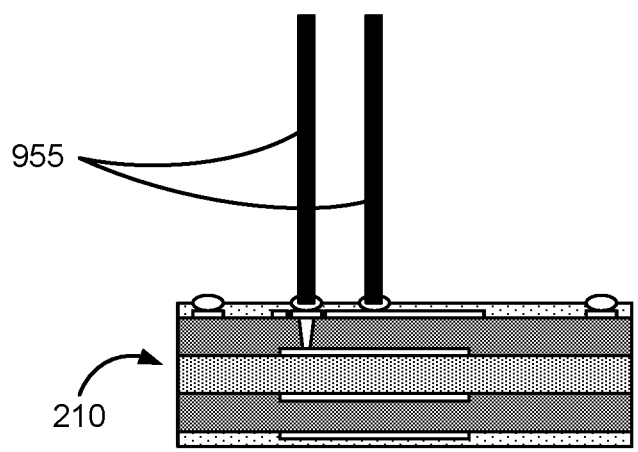
Figure 10C:
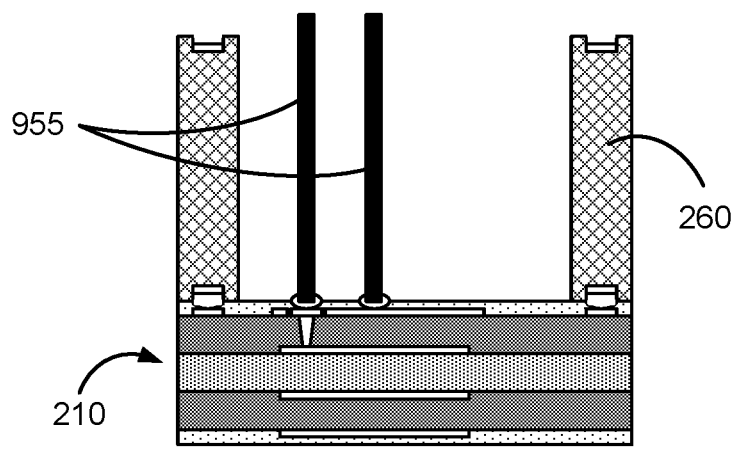
Figure 10D:
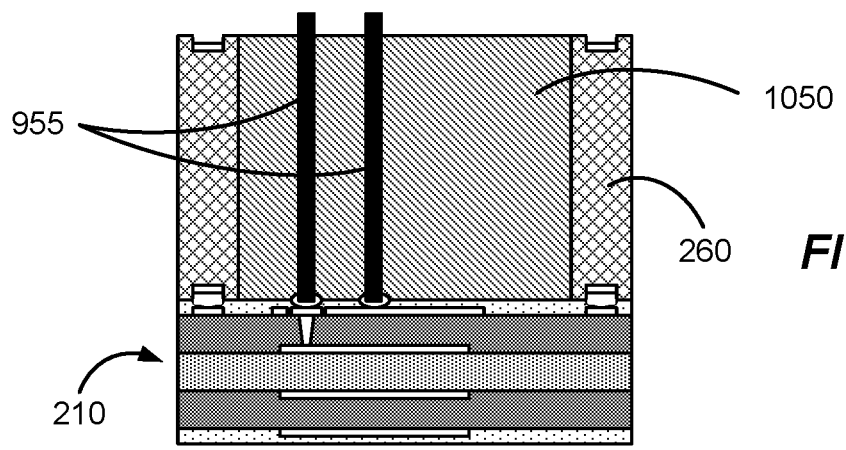
Figure 10E:
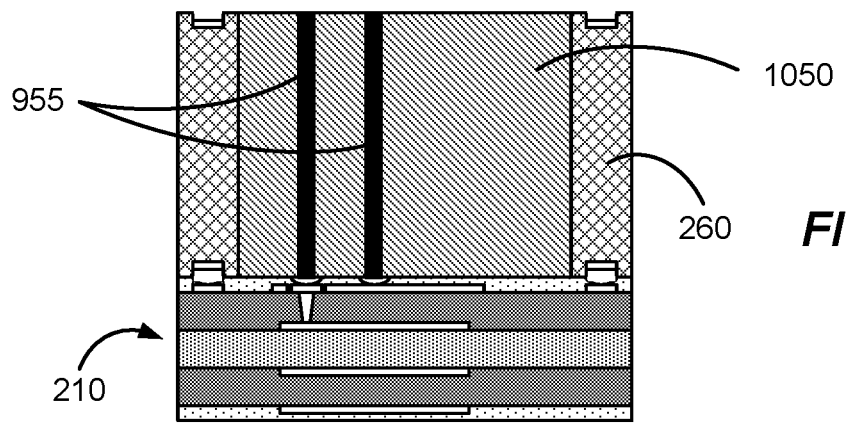
Figure 10F:
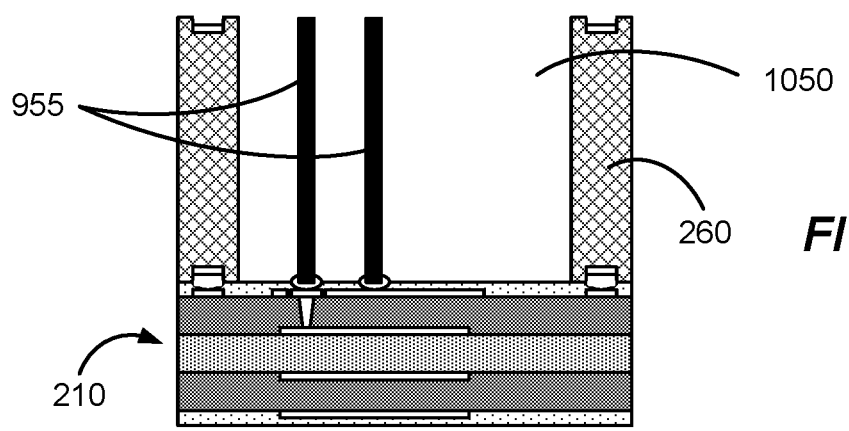
Figure 10G:
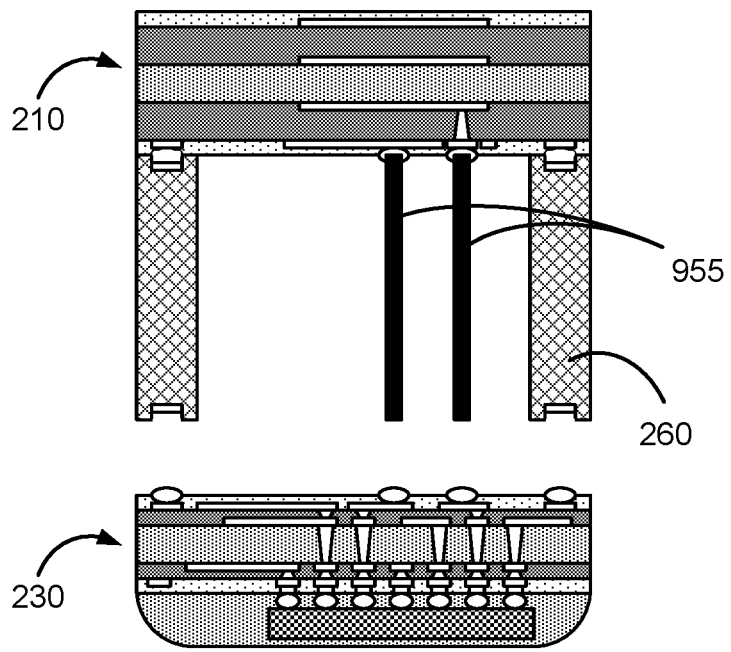
Figure 10H:
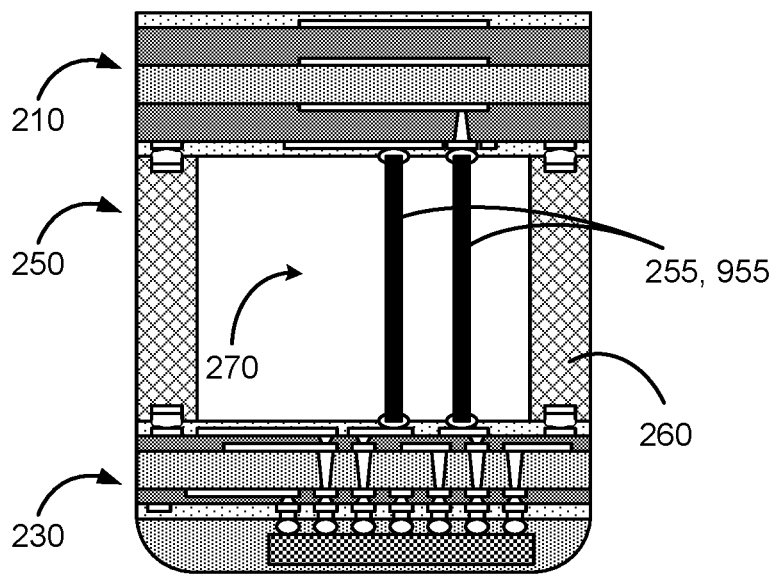

FIG. 9 illustrates a device 900 that uses another mechanism for electrically connecting the antenna package 210 with the RFIC package 230. In FIG. 9, the plurality of interconnects 255 may comprise a plurality of wirebonds 955. FIGS. 10A-10I illustrate different stages of an example process for assembling the device 900 of FIG. 9. FIG. 10A illustrates a stage in which the antenna package 210 may be provided. FIG. 10B illustrates a stage in which the wirebonds 955 may be attached to the antenna package 210. FIG. 10C illustrates a stage in which the supports 260 may be placed on the antenna package 210. FIG. 10D illustrates a stage in which a cavity between the supports 260 (area corresponding to the air gap 270) may be filled with a wirebond support material 1050. FIG. 10E illustrates a stage in which lapping may be performed. Note the differences in the lengths the wirebonds 955 between FIGS. 10D and 10E. FIG. 10F illustrates a stage in which the wirebond support material 1050 may be removed. FIG. 10G illustrates a stage the antenna package 210 may be flipped such that the supports 260 and the wirebonds 955 are in alignment with the RFIC package 230. FIG. 10H illustrates a stage in which the interconnect assembly 250 may be attached to the RFIC package 230. For example, a reflow solder process may be performed. The attaching may define the boundaries of the air gap 270 on all sides. While not illustrated, the external connect 290 may be attached to enable connections with external devices.

Figure 11A:
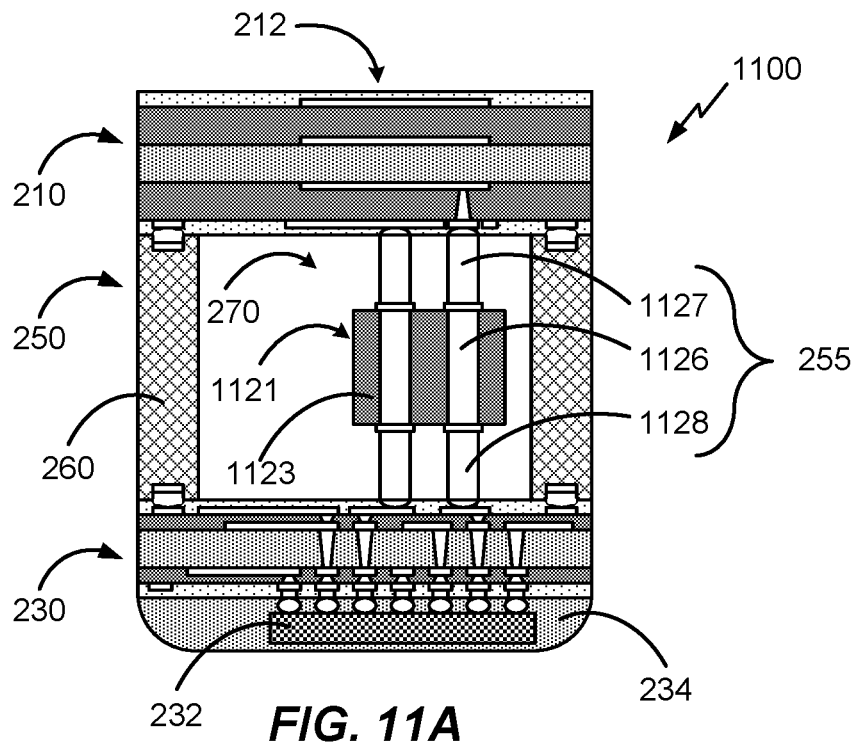
FIG. 11A illustrates an example of a device according to an aspect.

FIG. 11A illustrates a device 1100 that uses another mechanism for electrically connecting the antenna package 210 with the RFIC package 230. In FIG. 11A, the interconnect assembly 250 may comprise an interconnect board 1121 with a plurality of through-board-vias (TBVs) 1126 within a board substrate 1123. An example of the board substrate 1123 may be a PCB substrate.

The interconnect assembly 250 may also comprise a plurality of upper interconnects 1127 between the antenna package 210 and the interconnect board 1121. The plurality of upper interconnects 1127 may correspond to the plurality of TBVs 1126 such that each interconnect 255 may comprise an upper interconnect 1127 and its corresponding TBV 1126. That is, the plurality of interconnects 255 may comprise the plurality of upper interconnects 1127 and the plurality of TBVs 1126. The plurality of upper interconnects 1127 may electrically connect the antenna package 210 with the plurality of TBVs 1126. In particular, for each upper interconnect 1127, an upper end of the upper interconnect 1127 may be electrically connected to the antenna package 210, and a lower end of the upper interconnect 1127 may electrically connected to an upper end of the corresponding TBV 1126.

Alternatively or in addition thereto, the interconnect assembly 250 may comprise a plurality of lower interconnects 1128 between the interconnect board 1121 and the RFIC package 230. The plurality of lower interconnects 1128 may correspond to the plurality of TBVs 1126 such that each interconnect 255 may comprise a lower interconnect 1128 and its corresponding TBV 1126. That is, the plurality of interconnects 255 may comprise the plurality of TBVs 1126 and the plurality of lower interconnects 1128. The plurality of lower interconnects 1128 may electrically connect the RFIC package 230 with the plurality of TBVs 1126. In particular, for each lower interconnect 1128, a lower end of the lower interconnect 1128 may be electrically connected to the RFIC package 230, and an upper end of the lower interconnect 1128 may electrically connected to a lower end of the corresponding TBV 1126.

In FIG. 11A, two upper interconnects 1127, two TBVs 1126 and two lower interconnects 1128 are illustrated. A signal interconnect may be formed by one of the upper interconnects 1127, one of the TBVs 1126, and one of the lower interconnects 1128. A ground interconnect may be formed by the other of the upper interconnects 1127, the other of the TBVs 1126, and the other of the lower interconnects 1128.

The upper signal interconnect may be configured such that an upper end thereof is electrically connected to the antenna 212, and a lower end thereof is electrically connected to an upper end of the signal TBV. The upper ground interconnect may be configured such that an upper end thereof is electrically connected to the ground layer of the antenna package 210, and a lower end thereof is electrically connected to an upper end of the ground TBV.

The lower signal interconnect may be configured such that a lower end thereof is electrically connected to the RFIC 232, and an upper end thereof is electrically connected a lower end of the signal TBV. The lower ground interconnect may be configured such that a lower end thereof is electrically connected to the ground layer of the RFIC package 230, and an upper end thereof is electrically connected to a lower end of the ground TBV.

Of course, there can be many more upper interconnects 1127, TBVs 1126 and lower interconnects 1128 combining to serve as signal and ground interconnects. For shielding purposes, a plurality of ground TBVs may be provided to surround the signal TBV. A plurality of upper and lower ground interconnects may also be provided.

Figure 11B:
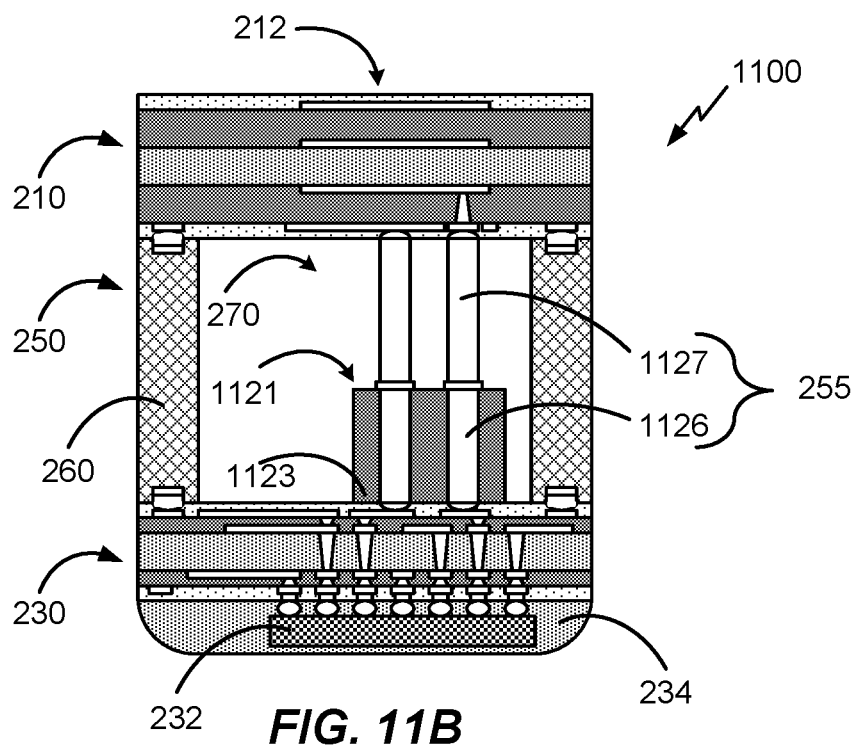
FIGS. 11B and 11C illustrate example variation of the device of FIG. 11A according to aspects.

Note that in an aspect, it is not necessary to include both the plurality of upper interconnects 1127 and the plurality of lower interconnects 1128. FIG. 11B illustrates an example of a variation of the device 1100 of FIG. 11A in which only the plurality of lower interconnects 1128 are not included, i.e., the plurality of interconnects 255 may comprise the plurality of upper interconnects 1127 and the plurality of TBVs 1126. In this instance, the lower ends of the TBVs 1126 may be electrically connected to the RFIC package 230.

While not illustrated, it is relatively straightforward to arrive at a device variation in which the plurality of upper interconnects 1127 are not included, i.e., the plurality of interconnects 255 may comprise the plurality of lower interconnects 1128 and the plurality of TBVs 1126. In this instance, the upper ends of the TBVs 1126 may be electrically connected to the antenna package 210.

Figure 11C:
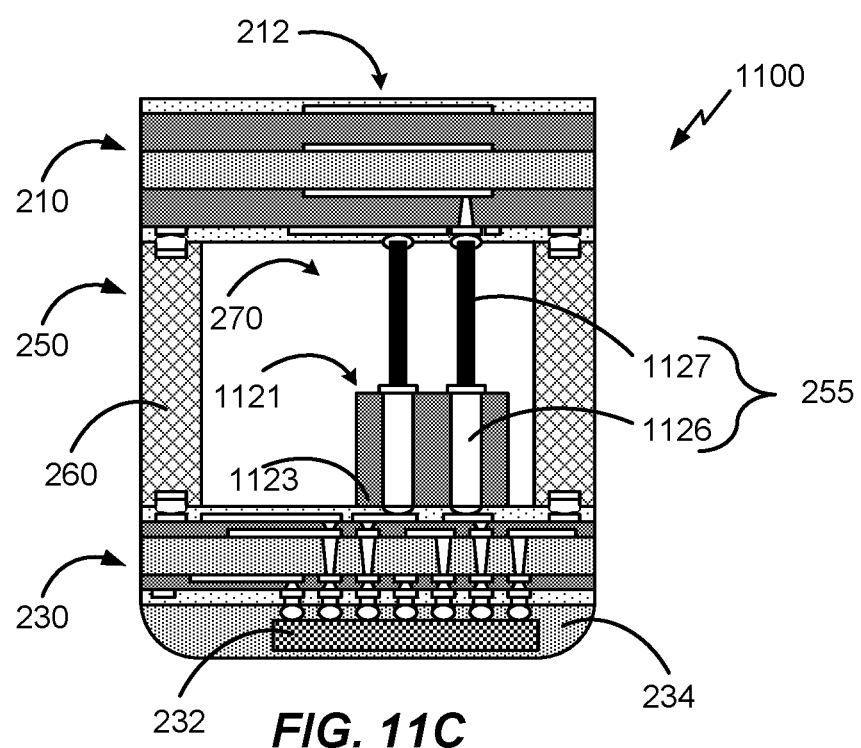

The upper interconnects 1127, the lower interconnects 1128, and the TBVs 1126 may be conductive columns such as copper columns. The upper and/or the lower interconnects 1127, 1128 may also be formed of other conductive materials such as wirebonds. This is illustrated in FIG. 11C. The device 1100 in FIG. 11C is similar to that of FIG. 11B except that the plurality of upper connectors 1127 may comprise wirebonds. While not illustrated, it is relatively straightforward to arrive at a device variation in which only the plurality of lower interconnects 1128 may be formed from wirebonds.

Figure 12A:
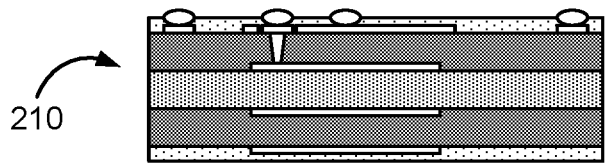
FIGS. 12A-12E illustrate different stages of an example process of assembling the device of FIG. 11A according to an aspect.
Figure 12B:
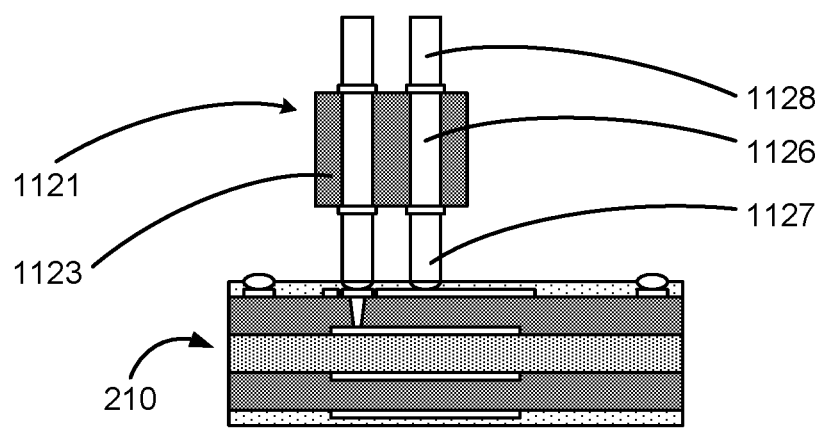
Figure 12C:
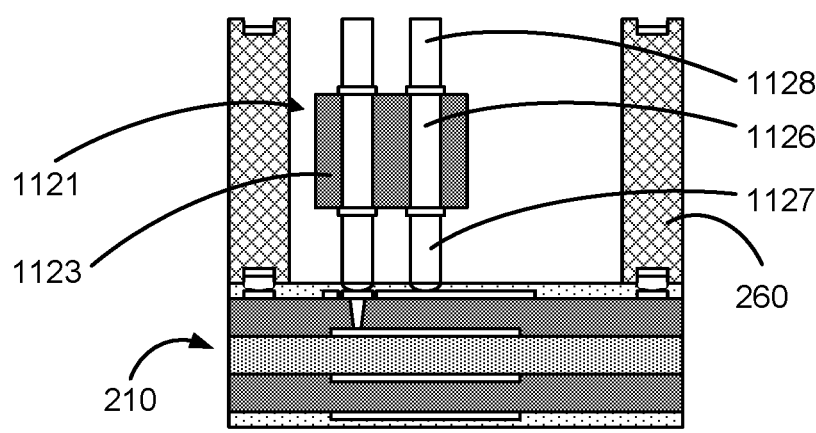
Figure 12D:
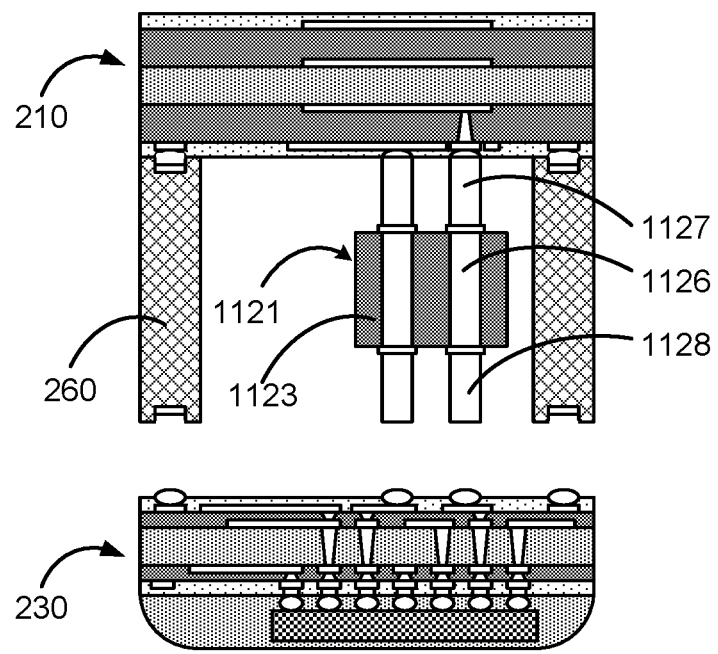
Figure 12E:
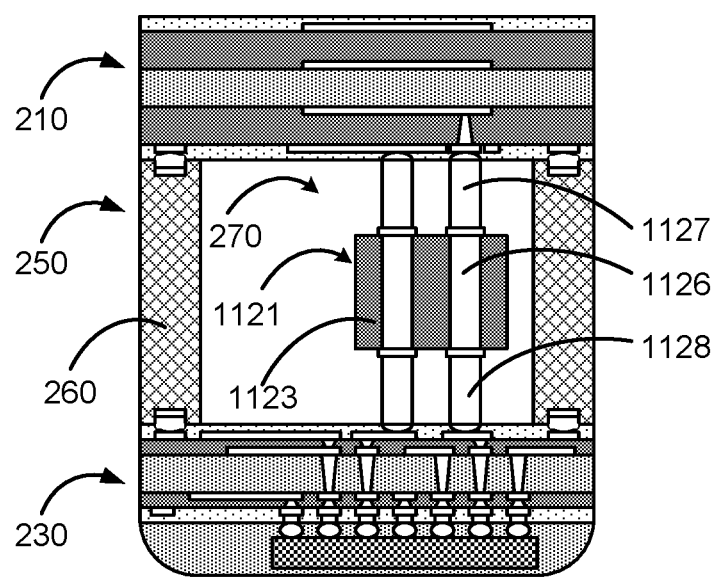

FIGS. 12A-12E illustrate different stages of an example process for assembling the device of FIG. 11A. FIG. 12A illustrates a stage in which the antenna package 210 may be provided. FIG. 12B illustrates a stage in which the interconnect board 1121 along with the plurality of interconnects 255 (e.g., TBVs 1126 and upper and/or lower interconnects 1127, 1128) may be provided and attached to the antenna package 210. For example, soldering may be performed. FIG. 12C illustrates a stage in which the supports 260 may be placed on the antenna package 210. FIG. 12D illustrates a stage in which the antenna package 210 may be flipped such that the supports 260 and the interconnects 255 (e.g., TBVs 1126 and upper and/or lower interconnects 1127, 1128) are in alignment with the RFIC package 230. FIG. 12E illustrates a stage in which the interconnect assembly 250 may be attached to the RFIC package 230. For example, the interconnects 255 may be joined to the RFIC package 230 through soldering. The attaching may define the boundaries of the air gap 270 on all sides. While not illustrated, the external connect 290 may be attached to enable connections with external devices.

Figure 13:
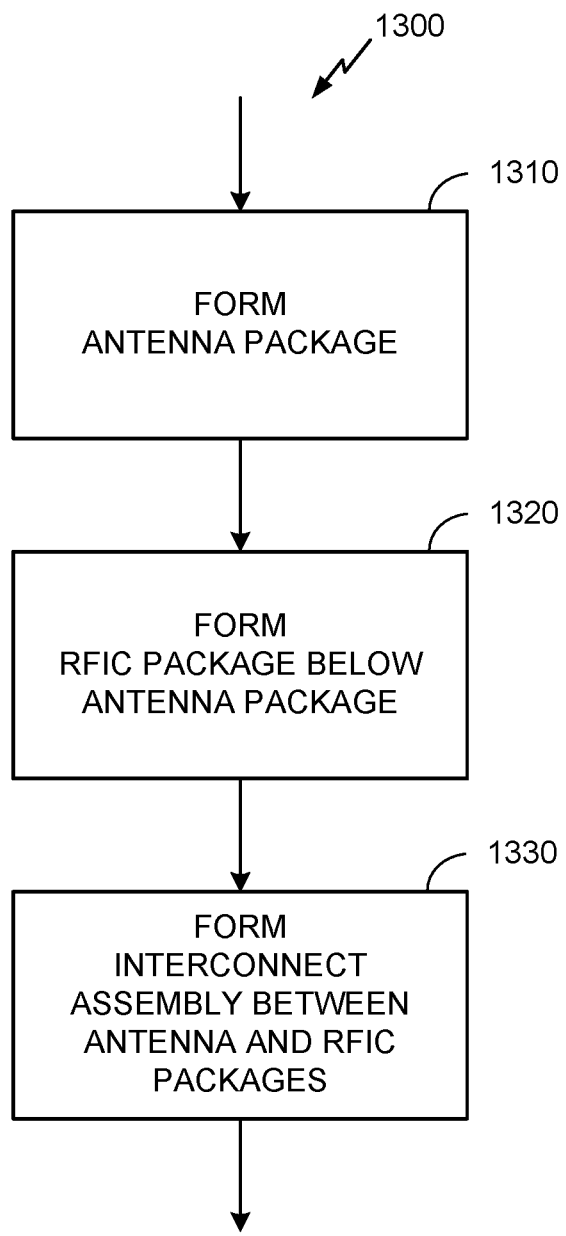
FIG. 13 illustrates a flowchart of an example method of fabricating a device according to an aspect.

FIG. 13 illustrates a flowchart 1300 of an example method of fabricating a device such as the devices 200, 500, 700, 900, 1100 discussed above and their variants. It should be noted that not all illustrated blocks of FIG. 13 need to be performed, i.e., some blocks may be optional. Also, the numerical references to the blocks of these figures should not be taken as requiring that the blocks should be performed in a certain order.

In block 1310, the antenna package 210 may be formed. Recall that the antenna package 210 may comprise one or more antennas 212. In block 1320, the RFIC package 230 may be formed below the antenna package 210. Recall that the RFIC package 230 may comprise the RFIC 232. FIGS. 4A-4D illustrate one example process to form the RFIC package 230.

In block 1330, the interconnect assembly 250 may be formed in between the antenna package 210 and the RFIC package 230. Recall that the interconnect assembly 250 may comprise a plurality of supports 260 including the first and second supports 260, and may also comprise the plurality of interconnects 255. The air gap 270 may be formed in the device 200, 500, 700, 900, 1100 in which the air gap 270 is bounded by the first and second supports 260, a lower surface of the antenna package 210, and an upper surface of the RFIC package 230. The plurality of interconnects 255 may be formed to be laterally positioned in between the first and second supports 260 within the air gap 270. FIGS. 6A-6B, 8A-8D, 10A-10G, and 12A-12E illustrate different example processes to from the interconnect assembly 250.

Figure 14:
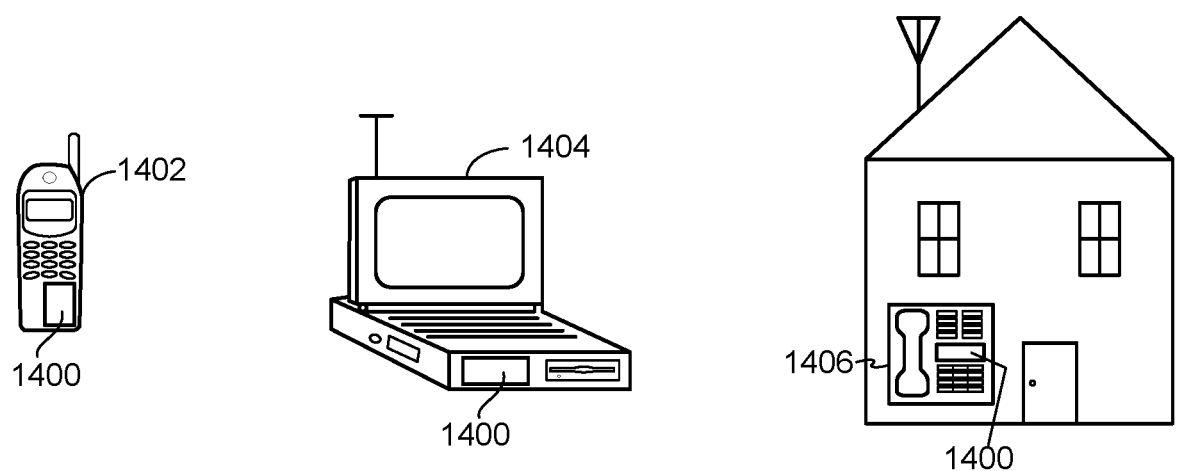
FIG. 14 illustrates examples of packages with a device integrated therein.

FIG. 14 illustrates various electronic devices that may be integrated with any of the aforementioned devices 200, 500, 700, 900 and 1100. For example, a mobile phone device 1402, a laptop computer device 1404, a terminal device 1406 as well as wearable devices, portable systems, that require small form factor, extreme low profile, may include a device/package 1400 that incorporates the devices 200, 500, 700, 900 and 1100 as described herein. The device/package 1400 may be, for example, any of the integrated circuits, dies, integrated devices, integrated device packages, integrated circuit devices, device packages, integrated circuit (IC) packages, package-on-package devices, system in package devices described herein. The devices 1402, 1404, 1406 illustrated in FIG. 14 are merely exemplary. Other electronic devices may also feature the device/package 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is connected with the processor such that the processor can read information from, and write information to, the storage medium. In the alternative, the storage medium may be integral to the processor.

Accordingly, an aspect can include a computer-readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A device, comprising:
    an antenna package comprising one or more antennas;
    an RFIC (radio frequency integrated circuit) package below the antenna package, the RFIC package comprising an RFIC; and
    an interconnect assembly in between the antenna package and the RFIC package, the interconnect assembly comprising:
        first and second supports extending from a lower surface of the antenna package to an upper surface of the RFIC package, the first and second supports configured to provide mechanical support to the antenna package; and
        a plurality of interconnects extending from the lower surface of the antenna package to the upper surface of the RFIC package, the plurality of interconnects configured to electrically connect the one or more antennas with the RFIC,
    wherein the first and second supports are electrically insulative such that there are no electrical paths between the antenna package and the RFIC package through the first and second supports,
    wherein there is an air gap in the device bounded by the first and second supports, the lower surface of the antenna package, and the upper surface of the RFIC package, and
    wherein the plurality of interconnects are laterally in between the first and second supports within the air gap.

2. The device of claim 1, wherein at least one antenna, at least one interconnect within the air gap, and the RFIC vertically overlap.

3. The device of claim 1, wherein the plurality of interconnects are configured such that at least one antenna is probe-fed from the RFIC.

4. The device of claim 1, wherein an aspect ratio of at least one interconnect is substantially equal to 2.0 or greater.

5. The device of claim 1, wherein the plurality of interconnects comprise one or more signal interconnects configured to carry signals between the RFIC and the one or more antennas.

6. The device of claim 5, wherein the plurality of interconnects comprise one or more ground interconnects configured to connect a ground layer of the RFIC package with a ground layer of the antenna package.

7. The device of claim 6, wherein the one or more ground interconnects are configured to shield the one or more signal interconnects.

8. The device of claim 6,
    wherein each signal interconnect comprises a signal column, and
    wherein each ground interconnect comprises a ground column.

9. The device of claim 6, wherein a plurality of ground interconnects surround at least one signal interconnect.

10. The device of claim 6, wherein at least one ground interconnect is shaped to at least partially surround at least one signal interconnect.

11. The device of claim 1, wherein the interconnect assembly further comprises a via bar comprising a substrate configured to surround the plurality of interconnects.

12. The device of claim 11, wherein the plurality of interconnects comprise a plurality of TBVs (through-board-vias).

13. The device of claim 11, wherein the first and second supports comprise the substrate.

14. The device of claim 1,
    wherein the interconnect assembly further comprises a flex substrate configured to physically route the plurality of interconnects between the antenna package and the RFIC package,
    wherein the flex substrate comprises a rigid portion and a flexible portion,
    wherein the flexible portion of the flex substrate is configured to laterally route the plurality of interconnects to electrically connect with the antenna package,
    wherein the rigid portion of the flex substrate is configured to vertically route the plurality of interconnects to electrically connect with the RFIC package, and
    wherein the rigid portion is positioned in the air gap.

15. The device of claim 1, wherein the plurality of interconnects comprise a plurality of wirebonds.

16. The device of claim 1,
    wherein the interconnect assembly further comprises an interconnect board in between the antenna package and the RFIC package, the interconnect board comprising a board substrate;
    wherein the plurality of interconnects comprise:
        a plurality of TBVs (through-board-vias) within the board substrate; and
        one or both of a plurality of upper interconnects and a plurality of lower interconnects,
    wherein if the plurality of upper interconnects are included,
        an upper end of each upper interconnect is electrically connected to the antenna package, and
        a lower end of each upper interconnect is electrically connected an upper end of a corresponding TBV, and
    wherein if the plurality of lower interconnects are included, an upper end of each lower interconnect is electrically connected to a lower end of a corresponding TBV, and a lower end of each lower interconnect is electrically connected the RFIC package.

17. The device of claim 16, wherein if the plurality of upper interconnects are not included, the upper end of each TBV is electrically connected to the antenna package, and wherein if the plurality of lower interconnects are not included, the lower end of each TBV is connected to the RFIC package.

18. The device of claim 16, wherein one or both of the plurality of upper interconnects and the plurality of lower interconnects are copper columns, or wherein one or both of the plurality of upper interconnects and the plurality of lower interconnects are wirebonds.

19. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

20. The device of claim 1, wherein the RFIC package comprises one or more dipole antennas.

21. The device of claim 1, wherein the air gap is completely enclosed by the first and second supports, the lower surface of the antenna package, and the upper surface of the RFIC package.

22. The device of claim 1, further comprising:

a first metal layer extending from the lower surface of the antenna package to the upper surface of the RFIC package and covering an inner sidewall of the first support, and/or a second metal layer extending from the lower surface of the antenna package to the upper surface of the RFIC package and covering an inner sidewall of the second support.

23. The device of claim 22, wherein the first metal layer is configured to connect to a ground layer of the RFIC package, and/or wherein the second metal layer is configured to connect to the ground layer of the RFIC package.

24. The device of claim 1, wherein first and second supports are opposite sides of one support structure that surrounds the plurality of interconnects between the lower surface of the antenna package and the upper surface of the RFIC package.

25. The device of claim 24, wherein the air gap is completely enclosed by the support structure, the antenna package, and the RFIC package.

26. A device, comprising:

an antenna package comprising one or more antennas;

an RFIC (radio frequency integrated circuit) package below the antenna package, the RFIC package comprising an RFIC; and an interconnect assembly in between the antenna package and the RFIC package, the interconnect assembly comprising:

first and second supports extending from a lower surface of the antenna package to an upper surface of the RFIC package, the first and second supports configured to provide mechanical support to the antenna package; and means for electrically connecting the one or more antennas with the RFIC, the means for electrically connecting extending from the lower surface of the antenna package to the upper surface of the RFIC package, wherein the first and second supports are electrically insulative such that there are no electrical paths between the antenna package and the RFIC package through the first and second supports, wherein there is an air gap in the device bounded by the first and second supports, the lower surface of the antenna package, and the upper surface of the RFIC package, and wherein the means for electrically connecting are laterally in between the first and second supports within the air gap.

27. The device of claim 26, wherein the air gap is completely enclosed by the first and second supports, the lower surface of the antenna package, and the upper surface of the RFIC package.

28. The device of claim 26, further comprising:

a first metal layer extending from the lower surface of the antenna package to the upper surface of the RFIC package and covering an inner sidewall of the first support, and/or a second metal layer extending from the lower surface of the antenna package to the upper surface of the RFIC package and covering an inner sidewall of the second support.

29. The device of claim 28, wherein the first metal layer is configured to connect to a ground layer of the RFIC package, and/or wherein the second metal layer is configured to connect to the ground layer of the RFIC package.

30. The device of claim 26, wherein first and second supports are opposite sides of one support structure that surrounds the means for electrically connecting between the lower surface of the antenna package and the upper surface of the RFIC package.

31. The device of claim 30, wherein the air gap is completely enclosed by the support structure, the antenna package, and the RFIC package.

* * * * *